United States Patent
Kim et al.

(10) Patent No.: US 10,818,241 B2
(45) Date of Patent: Oct. 27, 2020

(54) DISPLAY APPARATUS

(71) Applicant: LG DISPLAY CO., LTD., Seoul (KR)

(72) Inventors: Kyung-Rok Kim, Osan-si (KR); Taegung Kim, Osan-si (KR); Haejin Park, Osan-si (KR); EunJi Park, Osan-si (KR); Kimin Son, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/226,432

(22) Filed: Dec. 19, 2018

(65) Prior Publication Data

US 2019/0206330 A1     Jul. 4, 2019

(30) Foreign Application Priority Data

Dec. 29, 2017 (KR) .................. 10-2017-0184757

(51) Int. Cl.
    *G09G 3/3266*     (2016.01)
    *G09G 3/32*     (2016.01)
    (Continued)

(52) U.S. Cl.
    CPC ........... *G09G 3/3266* (2013.01); *G06F 3/044* (2013.01); *G06F 3/0412* (2013.01); *G06F 3/0446* (2019.05); *G06F 3/04164* (2019.05); *G06F 3/04166* (2019.05); *G09G 3/32* (2013.01); *G09G 3/3275* (2013.01); *H01L 27/323* (2013.01); *H01L 27/3255* (2013.01); *H01L 27/3276* (2013.01); *G09G 2310/027* (2013.01);
(Continued)

(58) Field of Classification Search
    CPC ...... G09G 3/3266; G09G 3/32; G09G 3/3275; G06F 3/04166; G06F 3/0446; G06F 3/04164; G06F 3/0412; G06F 3/044; H01L 27/03
    USPC ........ 345/77, 92, 174, 204; 361/752; 438/38
    See application file for complete search history.

(56) References Cited

U.S. PATENT DOCUMENTS 10,380,938 B2 * 8/2019 Su ................... H01L 27/3262
2004/0032637 A1   2/2004 Imamura
(Continued)

FOREIGN PATENT DOCUMENTS

CN     103579221 A     2/2014
CN     107093406 A     8/2017
(Continued)

OTHER PUBLICATIONS

Office Action dated Mar. 23, 2020 issued in corresponding Taiwanese Patent Application No. 107142521 (23 pages).

*Primary Examiner* — Prabodh M Dharia
(74) *Attorney, Agent, or Firm* — Polsinelli PC

(57) ABSTRACT

The display apparatus may include gate lines passing through a display area of a substrate, data lines passing through the display area of the substrate, pixel driving power lines passing through the display area of the substrate, a plurality of pixels having a pixel driving chip mounted on at least one pixel area defined on the substrate and connected and connected to an adjacent gate line and data line and a light emission part connected to the pixel driving chip, a gate driving chip array part mounted in a non-display area of the substrate and connected to the gate lines, and a data driving chip array part mounted in the non-display area of the substrate and connected to the data lines.

37 Claims, 14 Drawing Sheets

(51) Int. Cl.
  *G09G 3/3275*  (2016.01)
  *G06F 3/044*  (2006.01)
  *H01L 27/32*  (2006.01)
  *G06F 3/041*  (2006.01)

(52) U.S. Cl.
  CPC ..... *G09G 2310/06* (2013.01); *G09G 2310/08* (2013.01); *G09G 2330/021* (2013.01); *H01L 27/322* (2013.01); *H01L 27/3272* (2013.01)

(56) References Cited

U.S. PATENT DOCUMENTS

| | | | |
|---|---|---|---|
| 2006/0114249 A1* | 6/2006 | Imajo | G02F 1/13452 345/211 |
| 2006/0244711 A1* | 11/2006 | Kim | G02F 1/13452 345/100 |
| 2009/0303166 A1* | 12/2009 | Tsubata | G09G 3/342 345/87 |
| 2009/0325333 A1* | 12/2009 | Fukuchi | C25D 5/022 438/38 |
| 2010/0110359 A1* | 5/2010 | Lee | G02F 1/1345 349/149 |
| 2010/0207852 A1 | 8/2010 | Cok | |
| 2010/0265410 A1* | 10/2010 | Sugihara | G09G 3/3614 348/731 |
| 2011/0025732 A1 | 2/2011 | Wang | |
| 2011/0279014 A1 | 11/2011 | Winters et al. | |
| 2012/0026076 A1* | 2/2012 | Huang | G02F 1/136259 345/92 |
| 2012/0206428 A1 | 8/2012 | Cok | |
| 2012/0268453 A1 | 10/2012 | Hwang et al. | |
| 2013/0033429 A1* | 2/2013 | Silverbrook | G06F 3/0321 345/166 |
| 2014/0028534 A1* | 1/2014 | Park | G09G 3/34 345/84 |
| 2014/0153266 A1* | 6/2014 | Kim | G09F 9/301 362/418 |
| 2014/0173360 A1* | 6/2014 | Lee | H04L 25/0272 714/47.1 |
| 2014/0253498 A1* | 9/2014 | Suzuki | G06F 3/044 345/174 |
| 2015/0084946 A1* | 3/2015 | Shim | G09G 3/3258 345/212 |
| 2016/0073528 A1* | 3/2016 | Park | H01L 27/323 361/752 |
| 2016/0189625 A1* | 6/2016 | Kim | G09G 3/3233 345/205 |
| 2017/0115542 A1* | 4/2017 | Oh | G02F 1/136286 |
| 2018/0074358 A1* | 3/2018 | Jeon | G02F 1/13458 |
| 2018/0145124 A1* | 5/2018 | Kim | H01L 51/5253 |
| 2018/0233101 A1* | 8/2018 | Cao | G09G 3/3677 |
| 2019/0147803 A1* | 5/2019 | Liu | H01L 51/56 345/204 |
| 2019/0164470 A1* | 5/2019 | Cho | G09G 3/2096 |
| 2019/0204954 A1* | 7/2019 | Kim | G06F 3/04164 |
| 2019/0206324 A1* | 7/2019 | Kim | G09G 3/3233 |
| 2019/0278125 A1* | 9/2019 | Park | G02F 1/13452 |

FOREIGN PATENT DOCUMENTS

| | | |
|---|---|---|
| EP | 1533779 A1 | 5/2005 |
| GB | 2495507 A | 4/2013 |
| JP | 2014-513313 A | 5/2014 |
| TW | I486936 B | 2/2011 |
| TW | I460708 B | 11/2012 |
| WO | 2003/100753 A1 | 12/2003 |

* cited by examiner

DISPLAY APPARATUS

CROSS REFERENCE TO RELATED APPLICATION

This application claims the benefit of the Korean Patent Application No. 10-2017-0184757 filed on Dec. 29, 2017, which is hereby incorporated by reference in its entirety as if fully set forth herein.

BACKGROUND

Field of the Disclosure

The present disclosure relates to a display apparatus. Although the present disclosure is suitable for a wide scope of applications, it is particularly suitable for providing a display apparatus having a simplified configuration.

Description of the Background

A display apparatus is generally used as a display screen for various kinds of products such as television, notebook computer, and monitor as well as portable electronic devices such as electronic notebook, electronic book (e-book), portable multimedia player (PMP), a navigation device, ultra-mobile personal computer (UMPC), mobile phone, smartphone, tablet PC, and watch phone.

A general display apparatus includes a display panel having a plurality of pixels and a panel driving circuit for driving the plurality of pixels.

Each of the plurality of pixels includes one capacitor and a switching thin film transistor and a driving thin film transistor that are disposed on a substrate through a thin film transistor manufacturing process. Recently, four or more thin film transistors have been implemented in a pixel, and up to seven thin film transistors may need to be disposed.

A panel driving circuit includes a control board including a timing controller configured to receive image data from a display driving system or a display set and process the image data to generate digital data signals appropriate to a display panel, a power management integrated circuit configured to generate various kinds of power, and the like; a plurality of data driving integrated circuit configured to convert the digital data signals into analog data signals and provide the analog data signals to data lines of the display panel; a plurality of flexible circuit films configured to connect the plurality of data driving integrated circuits to the display panel; a source printed circuit board configured to deliver an output signal of a control board to the plurality of flexible circuit films, a signal cable configured to connect the control board to the source printed circuit board; and a plurality of gate driving circuits configured to drive gate lines of the display panel.

Such a general display apparatus has a problem with respect to a complicated configuration due to a panel driving circuit disposed outside the display panel.

SUMMARY

Accordingly, the present disclosure is directed to providing a display apparatus that substantially obviates one or more problems due to limitations and disadvantages of the related art.

An aspect of the present disclosure is directed to providing a display apparatus having a simplified configuration.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a display area having a plurality of pixel areas and a non-display area surrounding the display area, first to $n^{th}$ gate lines passing through the display area of the substrate; first to $m^{th}$ data lines passing through the display area of the substrate, first to $m^{th}$ pixel driving power lines passing through the display area of the substrate, a plurality of pixels each having a pixel driving chip mounted in at least one of the plurality of pixel areas of the substrate and connected to a gate line and a data line adjacent to the pixel driving chip and a light emission part connected to the pixel driving chip, a gate driving chip array part mounted in the non-display area of the substrate and connected to the first to $n^{th}$ gate lines, and a data driving chip array part mounted in the non-display area of the substrate and connected to the first to $m^{th}$ data lines.

In another aspect of the present disclosure, a display apparatus including a substrate where a display area and a non-display area are defined, a plurality of pixel areas disposed in the display area and the non-display area surrounding the display area includes first to $n^{th}$ gate lines passing through the display area, where n is a natural number; first to $m^{th}$ data lines passing through the display area, where m is a natural number; first to $m^{th}$ pixel driving power lines passing through the display area; a pixel driving chip mounted in at least one of the plurality of pixel areas and connected to a gate line, a data line, and a pixel driving power line adjacent to the pixel driving chip; a light emission part connected to the pixel driving chip; a gate driving chip array part mounted in the non-display area, connected to the first to $n^{th}$ gate lines and including first to $n^{th}$ gate driving chips connected to the first to nth gate lines on a one-to-one basis, and the first to $n^{th}$ gate driving chips are cascade-connected one another; and a data driving chip array part mounted in the non-display area and connected to the first to $m^{th}$ data lines.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION OF THE DISCLOSURE

Figure 1:
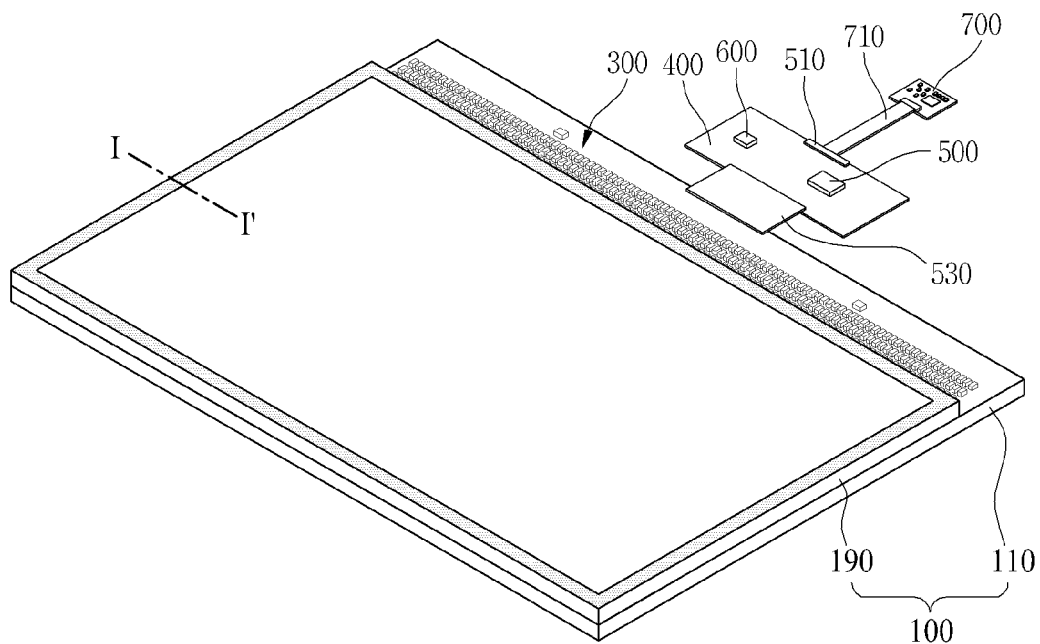
FIG. 1 is a view illustrating a display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of a display apparatus according to the present disclosure will be described in detail with reference to the accompanying drawings. In adding reference numerals to elements of each of the drawings, although the same elements are illustrated in other drawings, like reference numerals may refer to like elements. In the following description, when the detailed description of the relevant known function or configuration is determined to unnecessarily obscure the important point of the present disclosure, the detailed description will be omitted.

Figure 2:
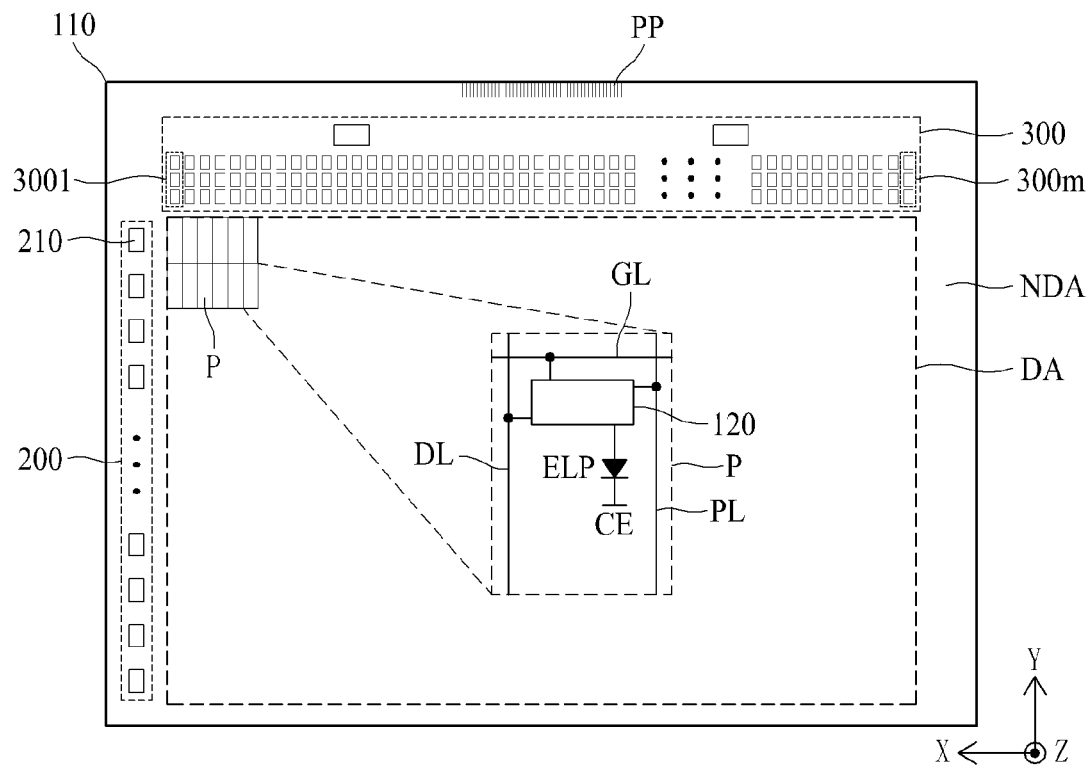
FIG. 2 is a plan view illustrating a substrate shown in FIG. 1.
Figure 3:
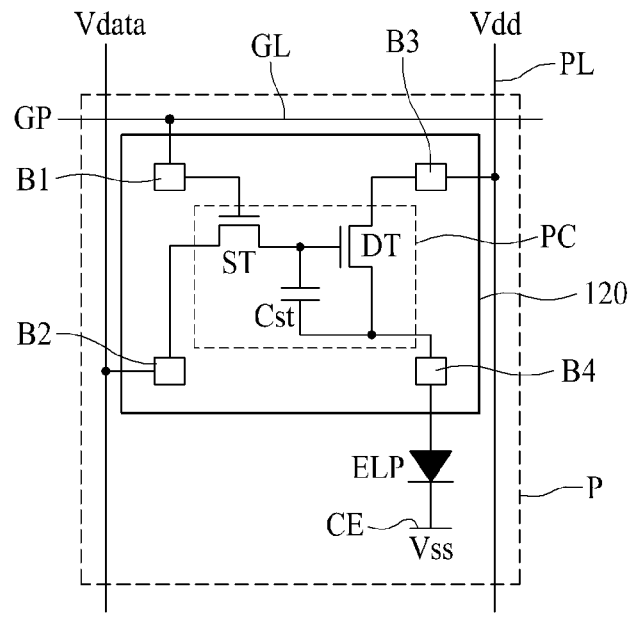
FIG. 3 is a view illustrating one pixel shown in FIG. 2.

FIG. 1 is a view illustrating a display apparatus according to an aspect of the present disclosure, FIG. 2 is a plan view illustrating a substrate shown in FIG. 1, and FIG. 3 is a view illustrating one pixel shown in FIG. 2.

Referring to FIGS. 1 to 3, the display apparatus according to an aspect of the present disclosure may include a display panel 100, and a gate driving chip array part 200 and a data driving chip array part 300 mounted on the display panel 100.

The display panel 100 may include a substrate 110 and an opposite substrate 190, which face each other. The substrate 110 may be a pixel array substrate. The opposite substrate 190 may be a color filter array substrate including a color filter. The substrate 110 has a larger size than the opposite substrate 190, and thus one side edge of the substrate 110 may not be covered with the opposite substrate 190 and thus may be exposed.

The substrate 110, which is a base substrate, may be formed of an insulating material such as glass, quartz, ceramic and plastic. For example, when the substrate 110 is formed of plastic, the substrate 110 may be a polyimide film and also a heat-resistant polyimide film, which may withstand high temperatures caused by a high-temperature deposition process. The substrate 110 may include a non-display area NDA and a display area DA having a plurality of pixel areas. The display area DA may be defined as an area where an image is to be displayed, and the non-display area NDA, which is an area where no image is displayed, may be defined as an edge of the substrate to surround the display area.

According to an aspect, the substrate 110 may include first to $m^{th}$ gate lines GL passing through the display area DA in a first direction X and first to $n^{th}$ data lines DL passing through the display area DA in a second direction Y intersecting the first direction X. Also, the substrate 110 may include first to $n^{th}$ pixel driving power lines PL arranged in parallel to the first to $n^{th}$ data lines DL, respectively. A plurality of pixel areas are defined in the display area DA by the first to $m^{th}$ gate lines GL and the first to $n^{th}$ data lines DL intersecting each other.

According to an aspect, the substrate 110 includes a plurality of pixels P for displaying images.

Each of the plurality of pixels P may include a pixel driving chip 120 and a light emission part ELP.

The pixel driving chip 120 is mounted in each pixel area and is connected to its adjacent gate line GL, data line DL, and pixel driving power line PL and also to the light emission part ELP. The plurality of pixel driving chips 120, each of which is a minimum unit of microchip or a single chipset, may be a single small-sized semiconductor packaging device with two or more transistors and one or more capacitors. Each of the plurality of pixel driving chips 120 controls light emission of the light emission part ELP by supplying, to the light emission part ELP, data current corresponding data voltage Vdata supplied from the data lines DL in response to gate pulses GP supplied from the gate lines GL, on the basis of pixel driving power Vdd supplied from the pixel driving power lines PL.

According to an aspect, each of the plurality of pixel driving chips 120 may include first to fourth bumps B1 to B4 and a pixel driving circuit PC.

The first bump B1 (or a gate bump) is electrically connected to its adjacent gate line GL to receive gate pulses GP from the gate line GL. The second bump B2 (or a date bump) is electrically connected to its adjacent data line DL to receive a data voltage Vdata from the data line DL. The third bump B3 (or a power input bump) is electrically connected to its adjacent pixel driving power line PL to receive pixel driving power Vdd from the pixel driving power line PL. The fourth bump B4 (or an output bump) is electrically connected to the light emission part ELP to provide a data current to the light emission part ELP.

The pixel driving circuit PC is connected to the first to fourth bumps B1 to B4, and is configured to output, to the fourth bump B4, a data current corresponding to a data voltage Vdata supplied through the second bump B2 in response to gate pulses supplied through the first bump B1 on the basis of pixel driving power Vdd supplied through the third bump B3.

According to an aspect, the pixel driving circuit PC (or an internal pixel driving circuit) may include a switching transistor ST, a driving transistor DT, and a capacitor Cst.

The switching transistor ST may include a gate electrode connected to the first bump B1, a first source/drain electrode connected to the second bump B2, and a second source/drain electrode connected to a gate electrode of the driving transistor DT. In this case, the first and second source/drain electrode of the switching transistor ST may be a source electrode or a drain electrode depending on the direction of the electric current. The switching transistor ST may be switched according to the gate pulses supplied through the first bump B1 to supply, to the driving transistor DT, the data voltage supplied through the second bump B2, The driving transistor DT includes a gate electrode connected to a second electrode of the switching transistor ST, a drain electrode configured to receive the pixel driving power Vdd through the third bump B3, and a source electrode connected to the fourth bump B4. The driving transistor DT may control light emission of the light emission part ELP by controlling a data current flowing from the third bump B3 to the light emission part ELP through the fourth bump B4, on the basis of the data voltage Vdata supplied from the switching transistor ST.

The capacitor Cst may be provided in an overlap region between the gate electrode and the source electrode of the driving transistor DT and may be configured to store the data voltage supplied to the gate electrode of the driving transistor DT and turn on the driving transistor DT with the stored voltage.

Optionally, the pixel driving circuit PC may further include at least one compensation transistor for compensating for a change in threshold voltage of the driving transistor DT. Further, the pixel driving circuit PC may further include at least one auxiliary capacitor. The pixel driving circuit PC may be additionally supplied with compensation power, such as an initialization voltage, depending on the number of transistors and the number of auxiliary capacitors. Accordingly, the pixel driving circuit PC according to this example may be changed to a pixel driving circuit PC of a well-known light emitting display apparatus for enabling the light emission part ELP to emit light through an electric current driving scheme. In this case, each of the plurality of pixel driving chips 120 may further include at least one bump depending on the number of power sources and the number of transistors of the pixel driving circuits PC. Additionally, power lines corresponding to the power sources may be additionally displayed on the substrate 110.

The light emission part ELP may emit light by the data current supplied from the pixel driving chip 120. Light generated through light emission of the light emission part ELP may be emitted to the outside through the opposite substrate 190 or the substrate 110.

According to an aspect, the light emission part ELP may include an anode electrode (or a first electrode) connected to the fourth bump B4 of the pixel driving chip 120, a light emitting layer connected to the anode electrode, and a cathode electrode CE (or a second electrode) connected to the light emitting layer. The light emitting layer may include any one of an organic light emitting layer, an inorganic light emitting layer, and a quantum dot light emitting layer or may include a stacked or mixed structure of the organic light emitting layer (or the inorganic light emitting layer) and the quantum dot light emitting layer.

The opposite substrate 190 may cover the plurality of pixels P disposed on the substrate 110. For example, the opposite substrate 190 may be a glass substrate, a flexible substrate, or a plastic film. For example, the opposite substrate 190 may be a polyethylene terephthalate film or a transparent polyimide film. The opposite substrate 190 may be bonded to the substrate 110 by means of a transparent adhesive layer.

The gate driving chip array part 200 is mounted in the non-display area NDA of the substrate 110 and is connected to the first to $n^{th}$ gate lines GL. The gate driving chip array part 200 sequentially supplies gate pulses GP to the gate lines GL in response to a gate clock and a gate start signal supplied through a pad part PP displayed in a first non-display area (or an upper non-display area) of the substrate 110. For example, the gate driving chip array part 200 may include first to $n^{th}$ gate driving chips 210 connected on a one-to-one basis to the first to $n^{th}$ gate lines GL.

As an example, the gate driving chip array part 200 may be mounted in a second non-display area (or a left non-display area) or a third non-display area (or a right non-display area) of the substrate 110 and may operate in a single feeding scheme to sequentially supply gate pulses GP to the first to $n^{th}$ gate lines GL.

As another example, the gate driving chip array part 200 may be mounted in the second non-display area (or the left non-display area) or the third non-display area (or the right non-display area) of the substrate 110 and may operate in a double feeding scheme to sequentially supply gate pulses GP to the first to $n^{th}$ gate lines GL.

As another example, the gate driving chip array part 200 may be mounted in the second non-display area (or the left non-display area) or the third non-display area (or the right non-display area) of the substrate 110 and may operate in an interlaced double feeding scheme to sequentially supply gate pulses GP to the first to $n^{th}$ gate lines GL.

The data driving chip array part 300 is mounted in the non-display area NDA of the substrate 110 and connected to the first to $n^{th}$ data lines DL. The data driving chip array part 300 converts a data signal supplied through the pad part PP disposed in the first non-display area (or the upper non-display area) of the substrate 110 into a data voltage Vdata and then supplies the data voltage Vdata to the first to $n^{th}$ data lines DL. For example, the data driving chip array part 300 may include a plurality of data driving chips for supplying a data voltage Vdata corresponding to each of the first to $m^{th}$ data lines DL.

The display apparatus according to an aspect of the present disclosure may include a control board 400, a timing controller 500, a power management circuit 600, and a display driving system 700.

The control board 400 may be connected, through a signal cable 530, to a pad part PP disposed at a side of the non-display area of the substrate 110.

The timing controller 500 may be mounted on the control board 400, and may be configured to generate a digital data signal through signal processing of an image signal and may provide the digital data signal to the data driving chip array part 300 and may also generate a gate clock and a gate start signal and may provide the gate clock and the gate start signal to the gate driving chip array part 200. That is, the timing controller 500 may receive an image signal and a timing synchronization signal provided from the display driving system 700 through a user connector 510 provided in the control board 400. The timing controller 500 may align the image signal appropriately for a pixel arrangement structure of the display area DA on the basis of the timing synchronization signal to generate a digital data signal, and may provide the generated digital data signal to the data driving chip array part 300. Also, the timing controller 500 may generate a gate clock and a gate start signal and may provide the gate clock and the gate start signal to the gate driving chip array part 200. According to an aspect, the timing controller 500 may provide a digital data signal, a reference clock, and a data start signal to the data driving chip array part 300 through a high-speed serial interface scheme, for example, an embedded point to point interface (EPI) scheme, a low-voltage differential signaling (LVDS) interface scheme, or a Mini LVDS interface scheme.

The power management circuit 600 may generate a transistor logic voltage, a ground voltage, pixel driving power, and a least one reference gamma voltage on the basis of input power provided from a power supply of the display driving system 700. The transistor logic voltage and the ground voltage may be used as driving power of the timing controller 500, the gate driving chip array part 200, the data driving chip array part 300, and the like. The ground voltage and the pixel driving power Vdd may be used for a plurality of pixels P, the gate driving chip array part 200, and the data driving chip array part 300. The plurality of reference gamma voltage may be used by the data driving chip array part 300 to convert digital data into an analog data voltage.

The display driving system 700 may be connected to the user connector 510 of the control board 400 through an interface cable 710. The display driving system 700 may generate an image signal from an image source and provide the generated image signal to the timing controller 500. In this case, the image signal may be provided to the timing controller 500 through a high-speed serial interface scheme, for example, a V-by-One interface scheme.

Figure 4:
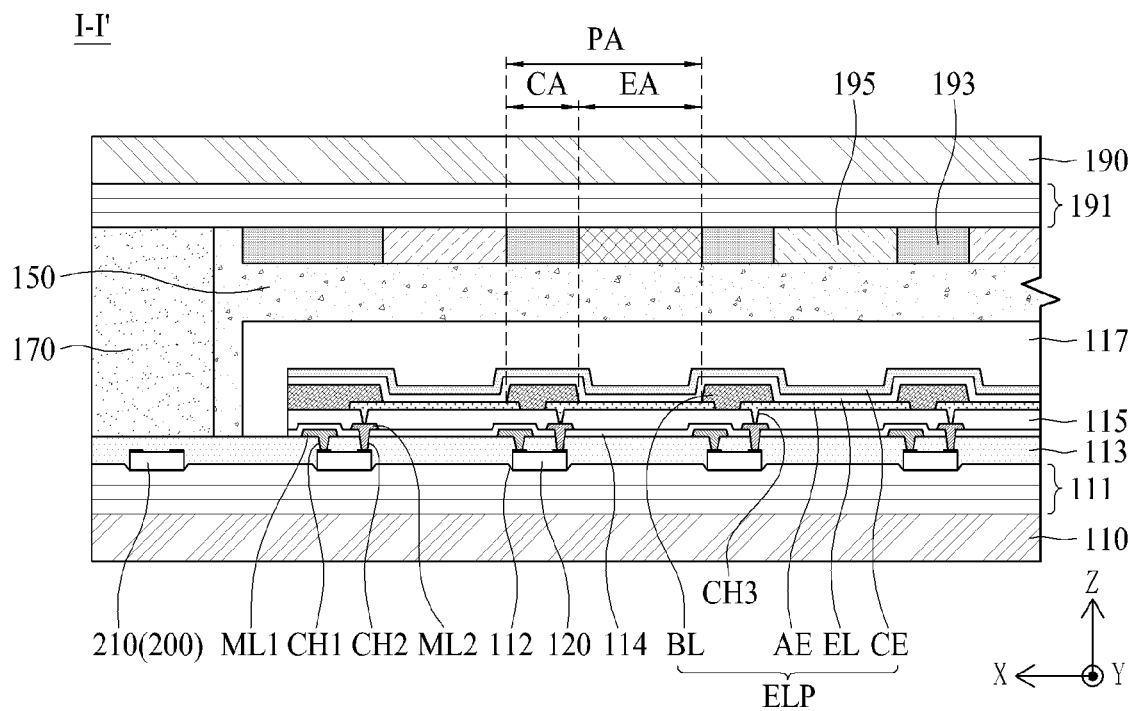
FIG. 4 is a cross-sectional view taken along line I-I' shown in FIG. 1.

FIG. 4 is a cross-sectional view taken along line I-I' shown in FIG. 1. This cross-sectional view is of three adjacent pixels disposed on the display panel shown in FIG. 1.

Referring to FIGS. 1 to 4, the display apparatus according to an aspect of the present disclosure may include a substrate 110, a buffer layer 111, a plurality of pixel driving chips 120, a gate driving chip array part 200, a data driving chip array part 300, a first planarization layer 113, a line layer, a second planarization layer 115, a light emission part ELP, and a sealing layer 117 (or an encapsulation layer).

The substrate 110, which is a pixel array substrate, may be formed of an insulating material such as glass, quartz, ceramic and plastic. The substrate 110 may include a plurality of pixel areas PA, each of which has a light emitting area EA and a circuit area CA.

The buffer layer 111 may be provided on the substrate 110. The buffer layer 111 may be configured to prevent water from penetrating into the light emission part ELP through the substrate 110. According to an aspect, the buffer layer 111 may include at least one inorganic layer formed of an inorganic material. For example, the buffer layer 111 is a multilayer in which an inorganic layer, which is any one of silicon oxide ($SiO_x$), silicon nitride ($SiN_x$), silicon oxynitride (SiON), titanium oxide ($TiO_x$), and aluminum oxide ($AlO_x$), is alternately stacked.

Each of the plurality of pixel driving chips 120 may be mounted on the buffer layer 111 in the circuit area CA of each of the plurality of pixel areas PA through a chip mounting (or transfer) process. Each of the plurality of pixel driving chips 120 may have a scale of 1 to 100 micrometers. However, the present disclosure is not limited thereto, and each of the plurality of pixel driving chips 120 may occupy a smaller area than the light emitting area EA, which indicates the pixel area PA except the circuit area CA. As described above, each of the plurality of pixel driving chips 120 may include first to fourth bumps B1 to B4 and a pixel driving circuit PC, and thus a repetitive description thereof will be omitted.

The plurality of pixel driving chips 120 may be attached onto the buffer layer 111 by means of an adhesive layer. The adhesive layer may be formed on a back surface (or a rear surface) of each of the plurality of pixel driving chips 120. In this case, during the chip mounting process, the pixel driving chip 120 having a back surface (or a rear surface) coated with the adhesive layer may be adsorbed onto a vacuum adsorption nozzle by vacuum and then mounted on (or transferred onto) a buffer layer 111 of a corresponding pixel area PA. Meanwhile, the plurality of pixel driving chips 120 may be attached to an adhesive layer provided on the entire upper surface of the buffer layer 111.

Optionally, the plurality of pixel driving chips 120 may be mounted on a plurality of concave portions 112 formed in the circuit area CA of each of the plurality of pixel areas PA.

The plurality of concave portions 112 may be concavely formed on a front surface of the buffer layer 111 displayed in the circuit area CA. For example, the plurality of concave portions 112 may have a form such as a groove or a cup having a certain depth from the front surface of the buffer layer 111. The plurality of concave portions 112 may correspondingly accommodate and fix the plurality of pixel driving chips 120, and thus it is possible to minimize an increase in thickness of the display apparatus caused by the thickness (or height) of the plurality of pixel driving chips 120.

According to an aspect, the plurality of concave portions 112 may be concavely formed to have a surface inclined at a certain angle while having a shape corresponding to that of the pixel driving chips 120. Thus, during a mounting process in which the pixel driving chips 120 are mounted on the buffer layer 111, it is possible to minimize misalignment between the circuit area CA and the pixel driving chips 120.

According to an aspect, the plurality of pixel driving chips 120 may be attached to bottom surfaces of the plurality of concave portions 112 by means of the adhesive layer coated on the plurality of concave portions 112. The plurality of pixel driving chips 120 according to another aspect may be attached to the bottom surfaces of the plurality of concave portions 112 by means of the adhesive layer coated on the entire front surface of the buffer layer 111 including the plurality of concave portions 112.

The gate driving chip array part 200 may include first to $n^{th}$ gate driving chips 210 mounted in the non-display area NDA of the substrate 110 and connected on a one-to-one basis to the first to $n^{th}$ gate lines GL. Like the pixel driving chips 120, each of the first to $n^{th}$ gate driving chips 210 may be mounted on (or transferred onto) a buffer layer 111 of a corresponding pixel area PA or may be disposed on a concave portion 112 provided in the buffer layer 111 of the corresponding pixel area PA by means of an adhesive.

The data driving chip array part 300 may include first to $m^{th}$ data driving chip groups 3001 to 300m mounted in the non-display area NDA of the substrate 110 and connected on a one-to-one basis to the first to $m^{th}$ data lines DL. Each of the first to $m^{th}$ data driving chip groups 3001 to 300m may include at least one data driving chip. Like the pixel driving chip 120, the data driving chip may be mounted on (or transferred onto) a buffer layer 111 of a corresponding pixel area PA or may be disposed on a concave portion 112 provided in the buffer layer 111 of the corresponding pixel area PA, by means of an adhesive.

The first planarization layer 113 may be disposed on the front surface of the substrate to cover the plurality of pixel driving chips 120 and the first to $n^{th}$ gate driving chips 210. That is, by covering all of the buffer layer 111, the plurality of pixel driving chips 120, and the first to $n^{th}$ gate driving chips 210 disposed on the substrate 110, the first planarization layer 113 provides a planarized surface onto the buffer layer 111, the plurality of pixel driving chips 120, and the first to $n^{th}$ gate driving chips 210 and also fix the plurality of pixel driving chips 120 and the first to $n^{th}$ gate driving chips 210. For example, the first planarization layer 113 may be formed of acryl resin, epoxy resin, phenolic resin, polyamide resin, or polyimide resin.

The line layer may include first metal lines ML1, an insulating layer 114, and second metal lines ML2.

The first metal lines ML1 are disposed on the first planarization layer 113 to pass over the display area DA in the first direction X or the second direction Y. The first metal lines ML1 may be used as the gate lines GL or as the data lines DL and the pixel driving power lines PL. For example, the first metal lines ML1 may be used as the gate lines GL. In this case, the gate lines GL composed of the first metal lines ML1 extend or protrude over the circuit area CA of each pixel area PA, and thus are electrically connected to a first bump B1 of a corresponding pixel driving chip 120 through a first chip contact hole CH1 provided on the first planarization layer 113, so that gate pulses GP are supplied to the first bump B1 of the pixel driving chip 120.

The insulating layer 114 may be disposed on the substrate 110 to cover the first metal lines ML1. For example, the insulating layer 114 may be silicon oxide ($SiO_x$), silicon nitride ($SiN_x$), silicon oxynitride (SiON), or a multilayer thereof.

The second metal lines ML2 may be disposed on the insulating layer 114 to pass over the display area DA in a direction intersecting the first metal lines ML1. The second metal lines ML2 may be used as the gate lines GL or as the data lines DL and the pixel driving power lines PL. For example, when the first metal lines ML1 may be used as the gate lines, the second metal lines ML2 may be used as the data lines DL and the pixel driving power lines PL. In this case, the data lines DL composed of the second metal lines ML2 extend or protrude over the circuit area CA of each pixel area PA, and thus are electrically connected to a second bump B2 of a corresponding pixel driving chip 120 through a second chip contact hole CH2 provided on the first planarization layer 113 and the insulating layer 114, so that a data voltage is supplied to the second bump B2 of the pixel driving chip 120. Also, the pixel driving power lines PL composed of the second metal lines ML2 extend or protrude over the circuit area CA of each pixel area PA, and thus are electrically connected to a third bump B3 of a corresponding pixel driving chip 120 through a third chip contact hole provided on the first planarization layer 113 and the insulating layer 114, so that the pixel driving power Vdd is supplied to the third bump B3 of the pixel driving chip 120. In this case, the third chip contact hole may be formed together with the second chip contact hole CH2.

The first metal lines ML1 and the second metal lines ML2 may be formed of molybdenum (Mo), aluminum (Al), silver (Ag), chrome (Cr), gold (Au), titanium (Ti), nickel (Ni), neodymium (Nd), copper (Cu), or an alloy thereof and may be formed as a single layer of the metal or alloy or as a multilayer of two or more layers.

The second planarization layer 115 is disposed on the substrate 110 to cover the line layer. That is, by being formed on the substrate 110 to cover the second metal lines ML2 and the insulating layer 114, the second planarization layer 115 may provide a planarized surface onto the second metal lines ML2 and the insulating layer 114. For example, the second planarization layer 115 may be formed of acryl resin, epoxy resin, phenolic resin, polyamide resin, or polyimide resin, but the present disclosure is not limited thereto.

The light emission part ELP may include a plurality of anode electrodes AE, a bank layer BL, a light emitting layer EL, and a cathode electrode CE.

Each of the plurality of anode electrode AE may be separately patterned for each pixel area PA. Each of the plurality of anode electrodes AE may be electrically connected to a fourth bump B4 of a corresponding pixel driving chip 120 through an anode contact hole CH3 provided on a second planarization layer 115 in a corresponding pixel area PA, and thus supplied with a data current through the fourth bump B4 of the pixel driving chip 120. According to an aspect, the plurality of anode electrodes AE may contain a metal material with high reflectance. For example, the plurality of anode electrodes AE may be formed as a multilayer structure such as a stacked structure (Ti/Al/Ti) of aluminum (Al) and titanium (Ti), a stacked structure (ITO/Al/ITO) of aluminum (Al) and indium tin oxide (ITO), and a stacked structure (ITO/APC/ITO) of APC alloy and ITO or may include a single-layer structure formed of any one material, or an alloy of two materials of silver (Ag), aluminum (Al), molybdenum (Mo), gold (Au), magnesium (Mg), calcium (Ca), and barium (Ba).

The bank layer BL, which defines the light emitting area EA for each of the plurality of pixel areas PA, may also be referred to as a pixel definition layer (or a separation film). The bank layer BL may be provided on the second planarization layer 115 and the edges of the plurality of anode electrodes AE to overlap the circuit area CA of the pixel area PA. Thus, the bank layer BL may define the light emitting area EA of each pixel area PA. As an example, the bank layer BL may be formed of an organic material, which is any one of acryl resin, epoxy resin, phenolic resin, polyamide resin, polyimide resin, benzocyclobutene resin, and fluorine resin. As another example, the bank layer BL may be formed of a photosensitive material containing a black pigment. In this case, the bank layer BL may serve as a shielding pattern.

The light emitting layer EL may be disposed in the light emitting area EA of the plurality of anode electrodes AE.

The light emitting layer EL according to an aspect includes two or more sub-light emitting layers for emitting white light. For example, the light emitting layer EL may include a first sub-light emitting layer and a second sub-light emitting layer to emit white light by mixing first light and second light. In this case, the first sub-light emitting layer, which emits the first light, may include any one of a blue light emitting layer, a green light emitting layer, a red light emitting layer, a yellow light emitting layer, and a yellow-green light emitting layer. The second sub-light emitting layer may include a light emitting layer that emits light of a color complementary to that of the first light, which is selected from among a blue light emitting layer, a green light emitting layer, a red light emitting layer, a yellow light emitting layer, and a yellow-green light emitting layer. Since the light emitting layer EL emits white light, the light emitting layer EL does not need to be separately patterned for each pixel area PA and may be formed on the substrate 110 to cover the plurality of anode electrodes AE and the bank layer BL.

Additionally, the light emitting layer EL may additionally include at least one or more functional layers to enhance the luminous efficiency and/or life span of the light emitting layer EL.

The cathode electrode CE may be disposed to cover the light emitting layer EL. The cathode electrode CE according to another aspect may be formed of indium tin oxide (ITO) or indium zinc oxide (IZO), which is a transparent conductive material such as transparent conductive oxide (TCO) so that the light emitted from the light emitting layer EL may be transmitted toward the opposite substrate 190.

The sealing layer 117 may be disposed on the substrate 110 to cover the light emission part ELP. The sealing layer 117 according to an aspect may be configured to prevent oxygen or water from penetrating into the light emitting layer EL of the light emission part ELP. According to an aspect, the sealing layer 117 may include an inorganic material, which is any one of silicon oxide ($SiO_x$), silicon nitride ($SiN_x$), silicon oxynitride (SiON), titanium oxide ($TiO_x$), and aluminum oxide ($AlO_x$).

Optically, the sealing layer 117 may further include at least one organic layer. The organic layer may be formed to a sufficient thickness to prevent particles from penetrating into a light emitting device layer through the sealing layer 117. As an example, the organic layer of the sealing layer 117 may be formed of an organic material, which is any one of acryl resin, epoxy resin, phenolic resin, polyamide resin, polyimide resin, benzocyclobutene resin, and fluorine resin.

According to an aspect of the present disclosure, the substrate 110 may further include a plurality of cathode power lines disposed in parallel to each other on the insulating layer 114 to pass through the display area DA, at least one data line DL being interposed therebetween.

Figure 5:
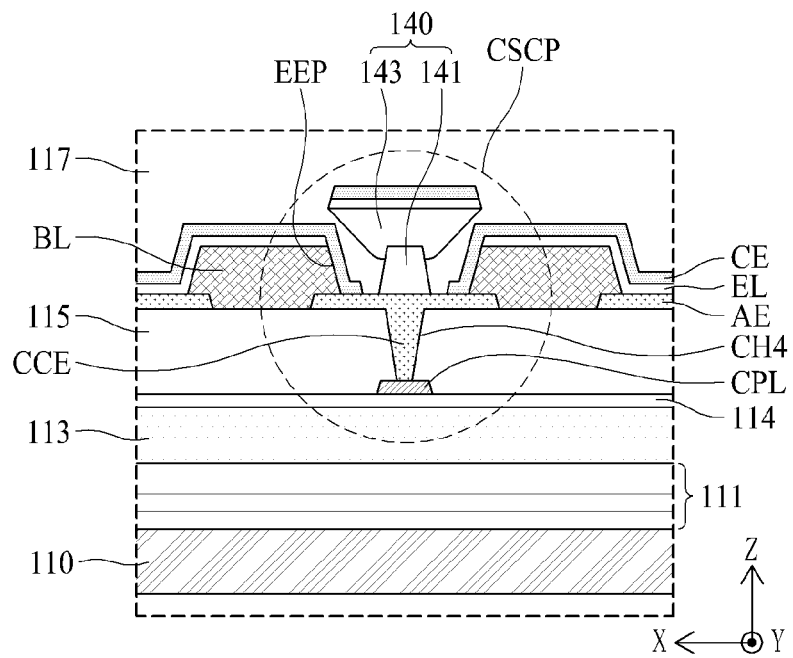
FIG. 5 is a view illustrating a connection structure between a cathode electrode and a cathode electrode power supply line according to an aspect of the present disclosure.

The plurality of cathode power lines may receive cathode power, for example, a ground voltage from the power management circuit 600 through the pad part PP. The plurality of cathode power lines may be selected from among the second metal lines ML2. That is, some of the second metal lines ML2 may be used as a plurality of cathode power lines. The plurality of cathode power lines are electrically connected to the cathode electrode CE in the display area DA. To this end, as shown in FIG. 5, the bank layer BL may include a plurality of cathode sub-contact parts CSCP to which the plurality of cathode power lines CPL and the cathode electrode CE are electrically connected.

The plurality of cathode sub-contact part CSCP may include a plurality of cathode connecting electrodes CCE and a plurality of electrode exposing parts EEP.

The plurality of cathode connecting electrodes CCE are disposed on the second planarization layer 115 overlapping the bank layer BL in the form of an island, and are formed of the same material along with the anode electrode AE. The edges other than center portions of the cathode connecting electrodes CCE may be surrounded by the bank layer BL so that the cathode connecting electrodes CCE may be separated apart from, and electrically isolated from, their adjacent anode electrodes AE. Each of the cathode connecting electrodes is electrically connected to a corresponding cathode power line CPL through a cathode contact hole CH4 provided on the second planarization layer 115. In this case, one cathode power line CPL may be electrically connected to at least one cathode connecting electrode CCE through at least one cathode contact hole CH4.

The plurality of electrode exposing parts EEP may be disposed on the bank layer overlapping the plurality of cathode connecting electrodes CCE, to expose the plurality of cathode connecting electrodes CCE. Thus, the cathode electrode CE may be electrically connected to the plurality of cathode connecting electrodes CCE exposed through the plurality of electrode exposing parts EEP and to the plurality of cathode power lines CPL through the plurality of cathode connecting electrodes CCE, and thus may have relatively low resistance. In particular, by receiving cathode power from the plurality of cathode power lines CPL through the plurality of cathode connecting electrodes CCE, it is possible to prevent luminance unevenness due to voltage drop (IR drop) of the cathode voltage supplied to the cathode electrode CE.

In addition, according to an aspect of the present disclosure, the substrate 110 may further include a partition wall part 140.

The partition wall part 140 may include a partition wall support part 141 displayed at each of the plurality of cathode connecting electrodes CCE and a partition wall 143 disposed on the partition wall support part 141.

The partition wall support part 141 may be formed in a tapered structure having a trapezoidal cross section at the center of each of the plurality of cathode connecting electrodes CCE.

The partition wall 143 may be formed on the partition wall support part 141 to have a reverse-tapered structure with a lower surface narrower than an upper surface, thus to cover a corresponding electrode exposing part EEP. For example, the partition wall 143 may include a lower surface having a first width supported by the partition wall support part 141, an upper surface having a second width greater than the first width and greater than or equal to the electrode exposing part EEP, and an inclined surface disposed between the lower surface and the upper surface to cover the electrode exposing part EEP. By the upper surface of the partition wall 143 being formed with a size greater than or equal to that of the electrode exposing part EEP to cover the electrode exposing part EEP, it is possible to prevent a light emitting material from penetrating into the cathode connecting electrode CCE exposed to the electrode exposing part EEP during deposition of the light emitting layer EL. Thus, during the deposition of the cathode electrode CE, the cathode electrode material may be electrically connected to the cathode connecting electrode CCE in which the cathode electrode material is exposed to the electrode exposing part EEP. A penetration space (or void) may be provided between the inclined surface of the partition wall 143 and the cathode connecting electrode CCE exposed to the electrode exposing part EEP, and the edge of the cathode electrode CE is electrically connected to the cathode connecting electrode CCE exposed to the electrode exposing part EEP through the penetration space.

Referring to FIGS. 1 to 4 again, the opposite substrate 190 may be defined as a color filter array substrate. As an example, the opposite substrate 190 includes a barrier layer 191, a black matrix 193, and a color filter layer 195.

The barrier layer 191 may be formed on the entire one surface of the opposite substrate 190 facing the substrate 110 to prevent penetration of external water or moisture. As an example, the barrier layer 191 may include at least one inorganic layer formed of an inorganic material. For example, the barrier layer 191 may be formed as a multilayer in which any inorganic layer, which is one of silicon oxide ($SiO_x$), silicon nitride ($SiN_x$), silicon oxynitride (SiON), titanium oxide ($TiO_x$), and aluminum oxide ($AlO_x$), is alternately stacked.

By being disposed on the barrier layer 191 to overlap the bank layer BL provided on the substrate 110, the black matrix 193 may define a plurality of transmissive parts overlapping the light emitting area EA of each pixel area PA. As an example, the black matrix 193 may be formed of a resin material or an opaque metal material such as chrome Cr or CrOx or may be formed of a light absorbing material.

The color filter layer 195 may be disposed in each of the plurality of transmissive parts provided by the black matrix 193. As an example, the color filter layer 195 may include any one of a red color filter, a green color filter, and a blue color filter. The red color filter, the green color filter, and the blue color filter may be repeatedly disposed in the first direction X.

Optionally, the color filter layer 195 may include quantum dots having a size to emit light of a predetermined color by re-emission according to according to light incident from the light emitting layer EL. In this case, the quantum dots may be selected from among CdS, CdSe, CdZnSeS, CdTe, ZnS, ZnSe, GaAs, GaP, GaAs—P, Ga—Sb, InAs, InP, InSb, AlAs, AlP, AlSb, and the like. For example, the red color filter may include quantum dots of CdSe or InP, which emit red light, the green color filter may include quantum dots of CdZnSeS, which emit green light, and the blue color filter may include quantum dots of ZnSe, which emit blue light. As described above, by the color filter layer 195 including quantum points, it is possible to increase color gamut.

The opposite substrate 190 may be bonded to the substrate 110 by means of a transparent adhesive layer 150.

The transparent adhesive layer 150 may be referred to as a filler. As an example, the transparent adhesive layer 150 is formed of a material capable of filling a gap between the substrate 110 and the opposite substrate 190 and also a transparent epoxy material capable of transmitting light, but the present disclosure is not limited thereto. The transparent adhesive layer 150 may be formed on the substrate 110 by a process such as inkjet, slit coating, or screen printing, but the present disclosure is not limited thereto. The transparent adhesive layer 150 may be formed on the opposite substrate 190.

Additionally, according to an aspect of the present disclosure, the display apparatus may further include a dam pattern 170 surrounding the outside of the transparent adhesive layer 150.

The dam pattern 170 may be provided at an edge of the opposite substrate 190 in the form of a closed loop. As an example, the dam pattern 170 may be provided to have a certain height at an edge of the barrier layer 191 provided in the opposite substrate 190. The dam pattern 170 may be configured to block the spread or overflow of the transparent adhesive layer 150 and also bond the substrate 110 to the opposite substrate 190. As an example, the dam pattern 170 may be formed of a high viscosity resin that may be cured by light such as ultraviolet light, for example, an epoxy material. Furthermore, the dam pattern 170 may be formed of an epoxy material including a getter material capable of adsorbing water and/or oxygen, but the present disclosure is not limited thereto. The dam pattern 170 may block external water and/or oxygen from penetrating into a gap between the substrate 110 and the opposite substrate 190 that are bonded to each other in order to protect the light emitting layer EL. Thus, it is possible to increase reliability of the light emitting layer EL while preventing the life span of the light emitting layer EL from being reduced by the water and/or oxygen.

Figure 6:
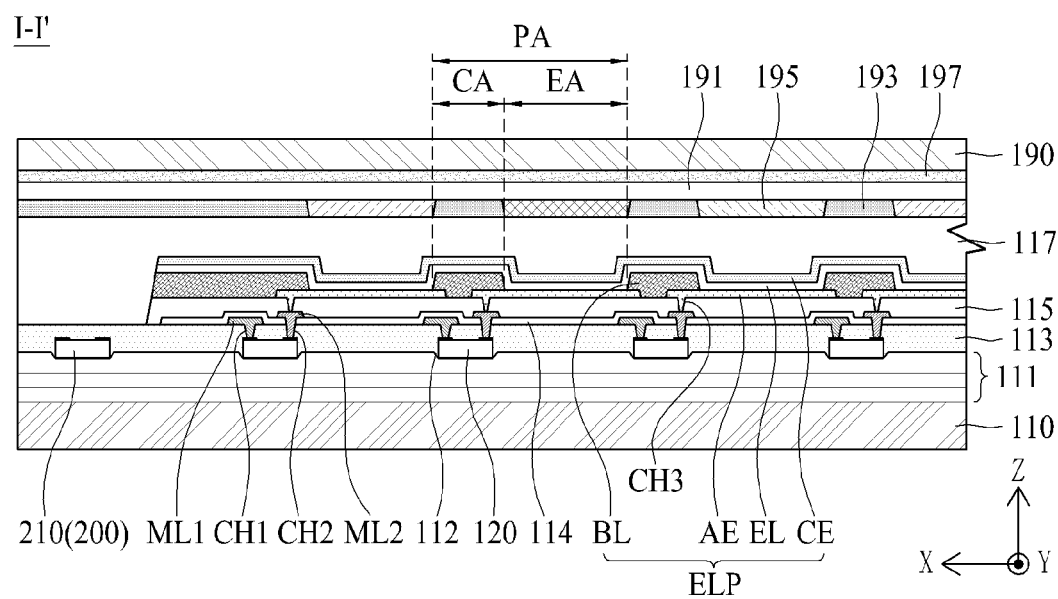
FIG. 6 is another cross-sectional view taken along line I-I' shown in FIG. 1.

The barrier layer 191, the black matrix 193, and the color filter layer 195 shown in FIG. 4 may be disposed on the sealing layer 117 of the substrate 110 rather than on the opposite substrate 190, as shown in FIG. 6.

Referring to FIG. 6, by being directly disposed on a front surface of the sealing layer 117 to overlap the bank layer BL provided in the substrate 110, the black matrix 193 may define a plurality of transmissive parts overlapping the light emitting area EA of each pixel area PA.

The color filter layer 195 may be formed on the front surface of the sealing layer 117 exposed by the plurality of transmissive parts provided by the black matrix 193. The color filter layer 195 is the same as described above, except that the color filter layer 195 is formed on the sealing layer 117, and thus a repetitive description thereof will be omitted.

As an example, the barrier layer 191 may be formed on the front surface of the sealing layer to cover the color filter layer 195 and the black matrix 193, and may provide a planarized surface onto the black matrix 193 and the color filter layer 195. In this case, when the barrier layer 191 may be formed through a high-temperature process, the light emitting layer EL or the like displayed on the substrate 110 may be damaged due to high temperatures. Thus, the barrier layer 191 may be formed of an organic material such as an acryl-based, epoxy-based, or siloxane-based organic insulating material that may be formed at a low temperature of 100° C. or less in order to prevent damage to the light emitting layer (EL) vulnerable to high temperatures.

The opposite substrate 190 may be attached to the front surface of the barrier layer 191 by means of an optical adhesive member 197 instead of the transparent adhesive layer 150. In this case, the optical adhesive member 197 may be an optically clear adhesive (OCA), an optically clear resin (OCR), or a pressure sensitive adhesive (PSA).

Since the opposite substrate 190 may be attached to the front surface of the barrier layer 191 by means of the optical adhesive member 197, the above-described dam pattern 170 may be omitted.

Figure 7:
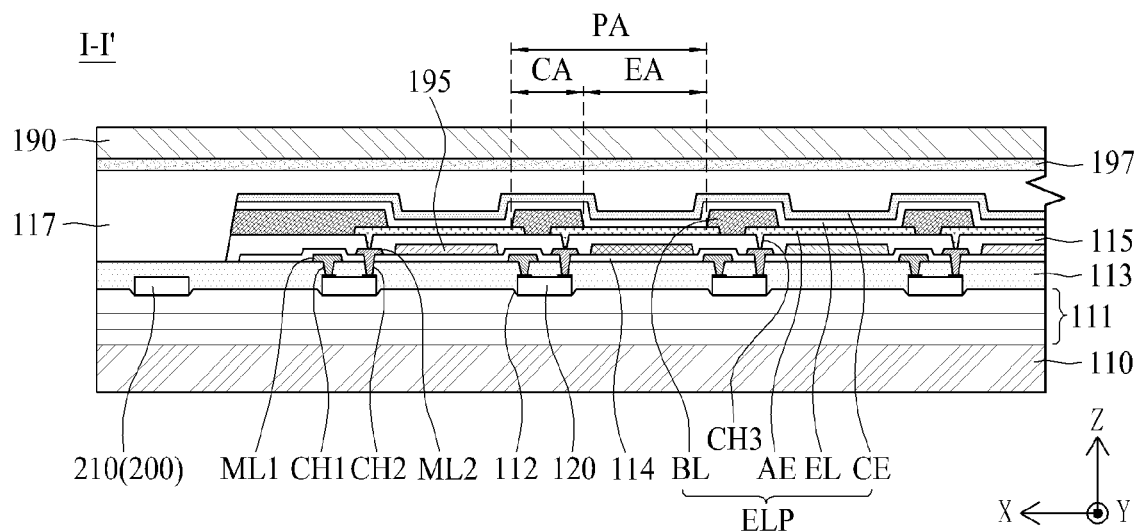
FIG. 7 is still another cross-sectional view taken along line I-I' shown in FIG. 1.

Also, as shown in FIG. 7, the color filter layer 195 shown in FIG. 6 may be disposed between the anode electrode AE and the substrate 110 to overlap the light emitting area EA of each pixel area PA. For example, the color filter layer 195 may be disposed on the buffer layer 111 or the second planarization layer 115 to overlap the light emitting area EA of each pixel area PA. In this case, the anode electrode AE may be formed of a transparent conductive material, and the cathode electrode CE may be formed of a metal material with high reflectance so that the light emitted from the light emitting layer EL may pass to the outside through the color filter layer 195 and the substrate 110 in sequence. When the arrangement structure of the color filter layer 195 may be applied, the opposite substrate 190 may be attached to the sealing layer 117 by means of the optical adhesive member 197, and the barrier layer 191 and the black matrix 193 may be omitted.

Figure 8:
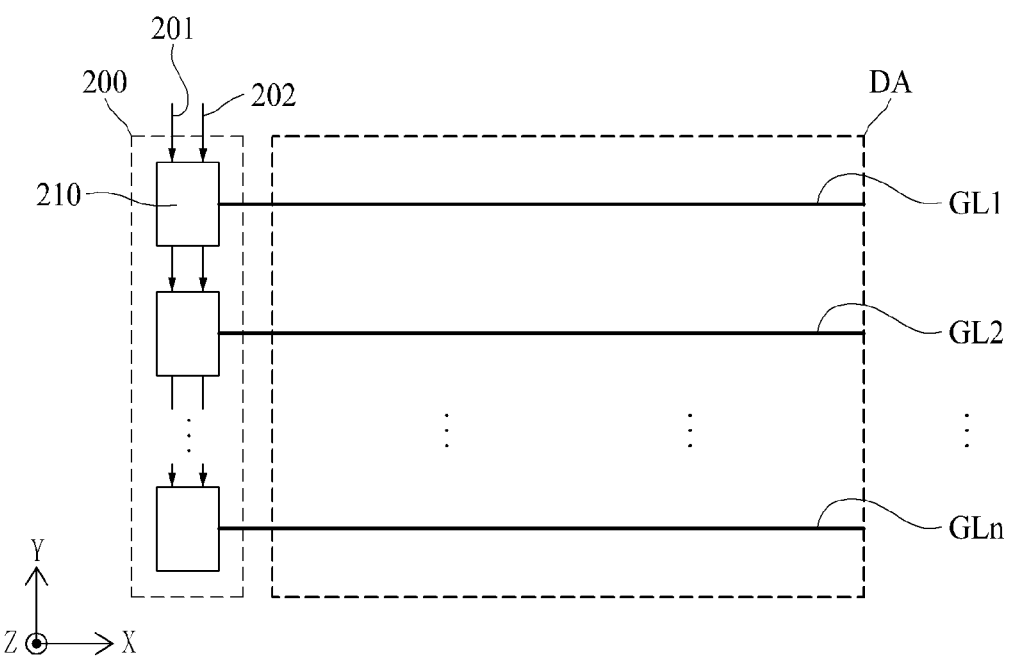
FIG. 8 is a view illustrating a gate driving chip array part shown in FIG. 2.
Figure 9:
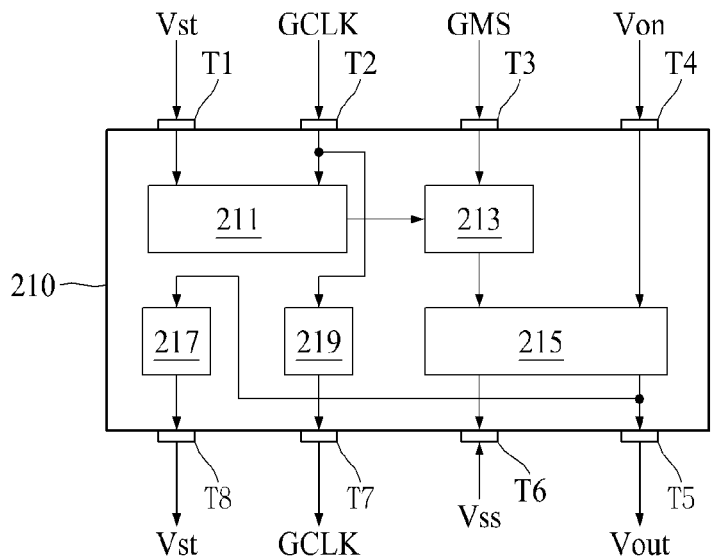
FIG. 9 is a view illustrating one gate driving chip shown in FIG. 8.
Figure 10:
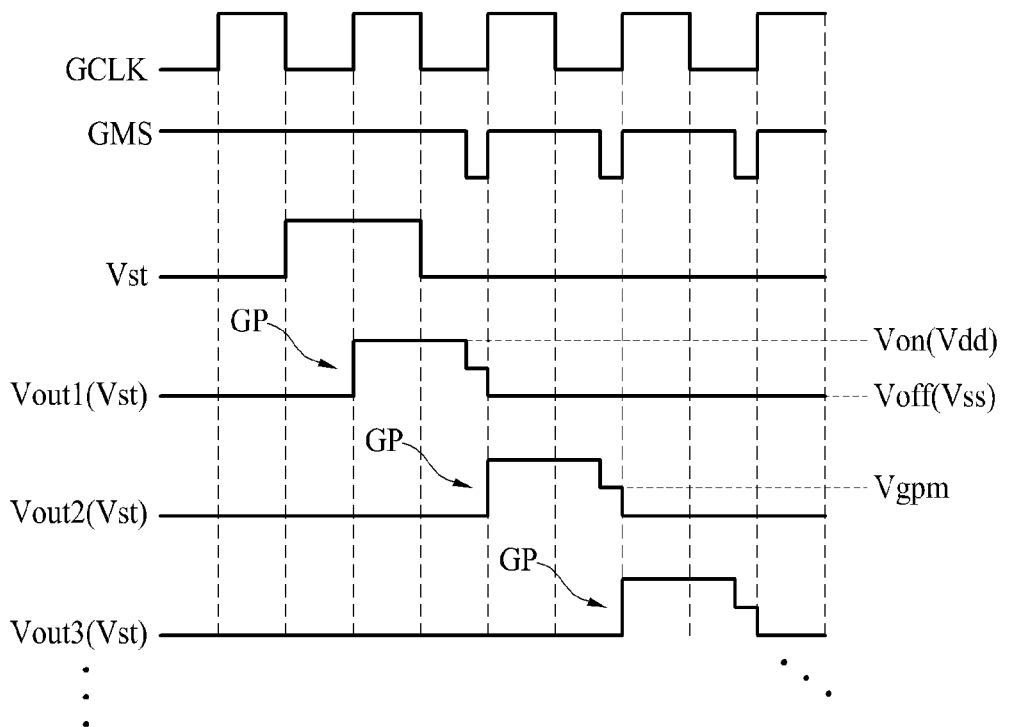
FIG. 10 is a waveform diagram illustrating input and output signals of the gate driving chip array part shown in FIG. 8.

FIG. 8 is a view illustrating the gate driving chip array part shown in FIG. 2, FIG. 9 is a view illustrating one gate driving chip shown in FIG. 8, and FIG. 10 is a waveform diagram illustrating input and output signals of the gate driving chip array part shown in FIG. 8.

Referring to FIGS. 8 to 10, according to an aspect of the present disclosure, the gate driving chip array part 200 may include the first to $n^{th}$ gate driving chips 210 connected on a one-to-one basis to the first to $n^{th}$ gate lines GL1 to GLn. In this case, the first to $n^{th}$ gate driving chips 210, each of which is a minimum unit of microchip or a single chipset, may be a single small-sized semiconductor packaging device including transistors.

The first to $n^{th}$ gate driving chips 210 may be connected in cascade to one another so that the first to $n^{th}$ gate driving chips 210 operate sequentially to supply gate pulses GP to the first to $n^{th}$ gate lines GL1 to GLn in sequence.

Each of the first to $n^{th}$ gate driving chips 210 may output a gate start signal Vst to a corresponding gate line GL as the gate pulses GP according to a gate clock GCLK and may supply an output signal Vout and the gate clock GCLK to a gate driving chip 210 disposed at the next stage. In this case, the gate start signal Vst may be supplied by a timing controller to the first gate driving chip 210 through a single gate start signal line 201. The gate clock GLCK may be supplied to the first gate driving chip 210 through a single gate clock line 202.

Each of the first to $n^{th}$ gate driving chips 210 according to an aspect may include a shift register 211 and a level shifter 215. For example, each of the first to $n^{th}$ gate driving chips 210 may include first to eighth terminals T1 to T8.

The shift register 211 of the first gate driving chip 210 shifts the gate start signal Vst supplied through the first terminal T1 according to the gate clock GCLK supplied through the second terminal T2 and then outputs the shifted signal. For example, each time the gate clock GCLK rises, the shift register 211 may output a shift signal with a voltage level corresponding to that of the gate start signal Vst.

By using the gate-on voltage Von and the gate-off voltage Vss, the level shifter 215 of the first gate driving chip 210 level-shifts the shifted signal output from the shift register 211 to the gate pulses GP having the gate-on voltage Von or the gate-off voltage Vss and then outputs the gate pulse GP. The gate pulses GP may be supplied to the first gate line GL1 through the fifth terminal T5 and also may be supplied to the first terminal T1 of the second gate driving chip 210 through the eighth terminal T8 as a gate start signal Vst. Also, the gate clock GCLK supplied through the second terminal T2 of the first gate driving chip 210 may be supplied to the second terminal T2 of the second gate driving chip 210 through the seventh terminal T7. In this case, the gate-on voltage Von, which is a pixel driving voltage provided from the power management circuit 600, may be supplied to the level shifter 215 through the fourth terminal T4, and the gate-off voltage Voff, which is a ground voltage provided from the power management circuit 600, may be supplied to the level shifter through the sixth terminal T6.

The shift registers of the second to $n^{th}$ gate driving chips 210 receive, through the first terminal T1, the gate start signal Vst and the gate clock GCLK supplied from the eighth terminal T8 and the seventh terminal T7 of the gate driving chip 210 at the previous stage, and output the gate start signal Vst as a shifted signal according to the received gate clock GCLK.

By using the gate-on voltage Von and the gate-off voltage Vss, the level shifters 215 of the second to $n^{th}$ gate driving chips 210 may level-shift the shifted signal output from the shift register 211 into the gate pulses GP having the gate-on voltage Von or the gate-off voltage Vss and may then output the gate pulse GP. In this case, the gate pulses GP output from the level shifter 215 of each of the second to $n^{th}$ gate driving chips 210 are supplied to a corresponding gate line, and also newly supplied as a gate start signal of the gate driving chip at the next stage, and the gate clock GCLM supplied to each of the second to $n^{th}$ gate driving chips 210 may be newly supplied as the gate clock GCLK of the gate driving chip 210 at the next stage.

Additionally, each of the first to $n^{th}$ gate driving chips 210 may further include a buffer disposed between the fifth terminal T5 and an output terminal of the level shifter 215. The buffer, which is an inverter-type buffer, may include an even number of inverters connected in series to each other and disposed between the fifth terminal T5 and the output terminal of the level shifter 215. By such a buffer buffering the gate pulses GP output from the level shifter 215 using the gate-on voltage and the gate-off voltage Vss and outputting the buffered gate pulses GP to the fifth terminal T5, it is possible to minimize a polling time variation between location-specific gate pulses GP of the gate lines GL due to the entire load of the gate lines GL.

According to this example, the first to $n^{th}$ gate driving chips 210 may be connected in cascade to one other to deliver the gate start signal and the gate clock to the gate driving chip 210 disposed at the next stage in a cascade manner. Thus, it is possible to reduce the number of lines needed for the gate driving chip array part 200.

According to this example, each of the first to $n^{th}$ gate driving chips 210 may further include a gate pulse modulator 213.

The gate pulse modulator 213 modulates the gate-on voltage Von of the shifted signal output from the shift register 211 into a gate pulse modulation voltage Vgpm according to a gate modulation signal GMS supplied through the third terminal T3. In this case, the gate modulation signal GMS, which is supplied by the timing controller to the gate pulse modulator 213 through the third terminal T3, is a signal for preventing a deterioration in image quality due to a kick-back voltage generated when a switching transistor built in the pixel driving chip is turned off by the shift signal modulating a slope or time decreasing from the gate-on voltage Von to the gate pulse modulation voltage Vgpm. Thus, by the gate pulse modulator 213 modulating the gate-on voltage Von of the shift signal output from the shift register 211 into the gate pulse modulation voltage Vgpm according to the gate modulation signal, it is possible to prevent a deterioration in image quality due to the kick-back voltage.

Optionally, each of the first to $n^{th}$ gate driving chips 210 according to this example may further include a gate modulation signal generation unit configured not to receive the gate modulation signal GMS supplied through the third terminal T3 but to autonomously generate a gate modulation signal GMS on the basis of the gate clock GCKL input through the second terminal T2.

As an example, the gate modulation signal generation unit may include an RC delay circuit. The RC delay circuit may delay the gate clock GCLK according to an RC time constant corresponding to a predetermined resistor value and capacitor value to generate the gate modulation signal GMS.

As another example, the gate modulation signal generation unit may include an internal oscillator configured to generate an internal clock signal in response to the gate start signal Vst input through the first terminal T1 and an internal counter configured to count the internal clock signal to generate a gate modulation signal GMS.

Also, by using the gate-on voltage Von and the gate-off voltage Vss, the level shifters 215 of the first to $n^{th}$ gate driving chips 210 may level-shift the modulated shifted signal output from the gate pulse modulator 213 into the gate pulses GP having the gate-on voltage Von or the gate-off voltage Vss and may then output the gate pulses GP.

Additionally, each of the first to $n^{th}$ gate driving chips 210 according to this example may further include a clock delay 217.

The clock delay 217 may delay the gate pulse GP input from the level shifter 215 by a predetermined time and output the delayed gate pulse GP through the eighth terminal T8. For example, the clock delay 217 may be implemented as an RC circuit using an RC time constant. Thus, in each of the first to $n^{th}$ gate driving chips 210, an output time of the gate pulses GP transmitted (or delivered) as the gate start signal Vst of the gate driving chip at the next stage may be delayed from the output time of the gate clock GCLK. That is, according to this example, by setting the output time of the gate start signal Vst output by the gate driving chip 210 to be later than the output time of the gate clock GCLK, it is possible to secure a stable rising time of the gate start signal Vst supplied to the gate driving chip 210 at the next stage.

Each of the first to $n^{th}$ gate driving chips 210 according to this example may further include a clock buffer 219.

The clock buffer 219 may buffer the gate clock GCLK input through the second terminal T2 and output the buffered gate clock GCLK through the seventh terminal T7. For example, the clock buffer 219, which is an inverter-type buffer, may include an even number of inverters connected in series to one another and disposed between the second terminal T2 and the seventh terminal T7. By the clock buffer 219 buffering the gate clock GCLK input through the second terminal T2 using the gate-on voltage Von and the gate-off voltage Vss and outputting the buffered gate clock GCLK to the seventh terminal T7, it is possible to minimize a voltage drop of the gate clock GCLK that occurs while the gate clock GCLK is delivered in a cascade manner.

Optionally, the clock buffer 219 may include a clock delay circuit. The clock delay circuit may delay the gate clock GCLK input through the second terminal T2 or the buffered gate clock GCLK by a predetermined time and may output the delayed gate clock GCLK through the seventh terminal T7. Thus, by setting the output time of the gate clock GCLK output by the gate driving chip 210 to be later than the output time of the gate start signal Vst, it is possible to secure a stable rising time of the gate start signal Vst supplied to the gate driving chip 210 at the next stage. When the clock buffer 219 includes a clock delay circuit, the above-described clock delay 217 will be omitted.

Figure 11:
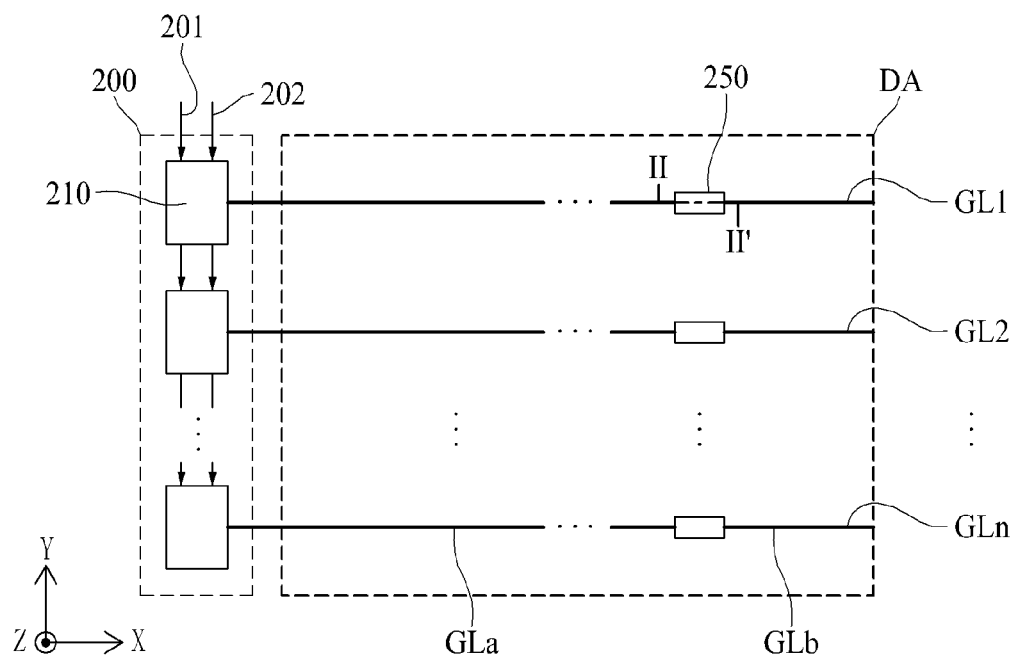
FIG. 11 is a view for explaining a gate buffer chip of the display apparatus according to an aspect of the present disclosure.
Figure 12:
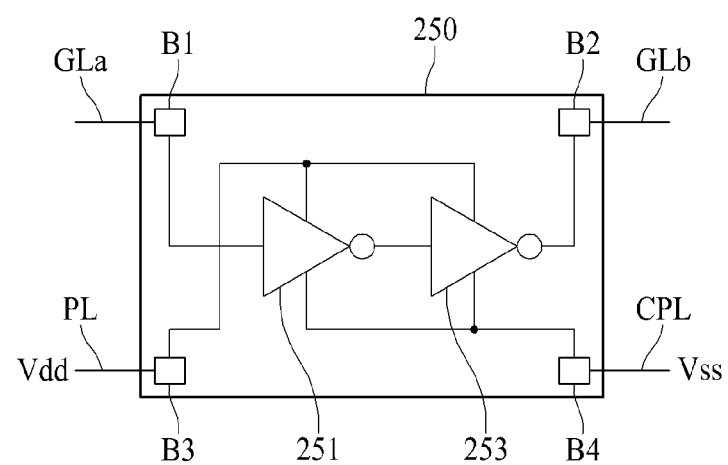
FIG. 12 is a view schematically illustrating a structure of the gate buffer chip shown in FIG. 11.
Figure 13:
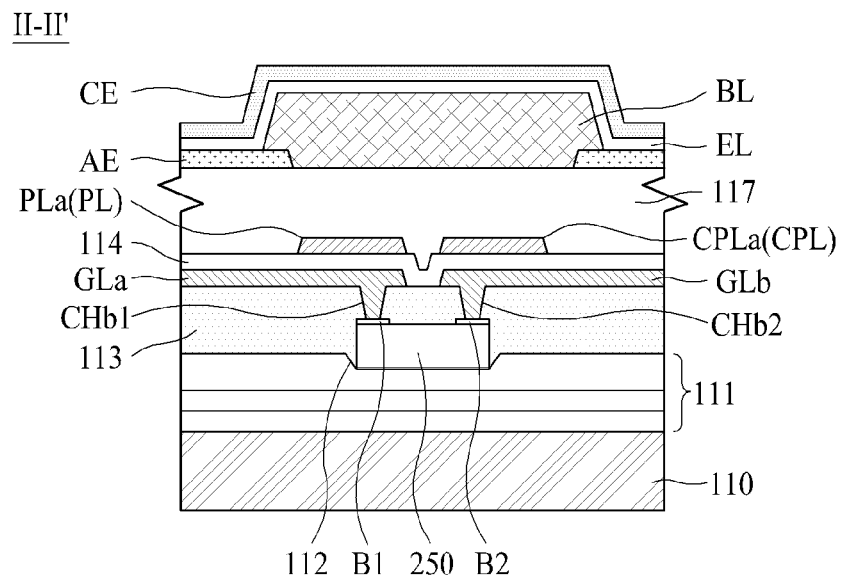
FIG. 13 is a cross-sectional view taken along line II-IT shown in FIG. 11.

FIG. 11 is a view for explaining a gate buffer chip of the display apparatus according to an aspect of the present disclosure, FIG. 12 is a view schematically illustrating a structure of the gate buffer chip shown in FIG. 11, and FIG. 13 is a cross-sectional view taken along line II-II' shown in FIG. 11.

Referring to FIGS. 11 to 13, the display apparatus according to an aspect of the present disclosure may further include a gate buffer chip 250 mounted in the display area DA of the substrate and connected to the first to $n^{th}$ gate lines GL1 to GLn. In this case, the gate buffer chip 250, which is a minimum unit of microchip or a single chipset, may be a single small-sized semiconductor packaging device with an integrated circuit including transistors.

First, a display apparatus including a high-resolution large-area display panel may be driven at high speeds according to a frame frequency of 120 Hz or higher. Thus, gate pulses applied to one gate line GL have different location-specific polling times depending on the entire load of the gate lines GL, and thus a deterioration in image quality may occur due to a luminance deviation between the left and right sides of the display panel. Thus, according to this example, by placing at least one gate buffer chip 250 on the first to $n^{th}$ gate lines GL1 to GLn, it is possible to prevent a deterioration in image quality due to a load deviation between the gate lines GL.

Each of the first to $n^{th}$ gate lines GL1 to GLn may be divided into first and second partial lines GLa and GLb by a separation part disposed on the display area DA. The first and second partial lines GLa and GLb of each of the first to n gate lines GL1 to GLn may be first metal lines ML1 disposed on the first planarization layer 113.

The gate buffer chip 250 may be mounted on the buffer layer 111, or the concave portion 112 provided on the buffer layer 111, to overlap the separation part located between the first and second partial lines GLa and GLb of each of the first to $n^{th}$ gate lines GL1 to GLn, and may be configured to electrically connect the first and second partial lines GLa and GLb, may buffer a gate pulse supplied through the first partial line GLa, and may supply the buffered gate pulse to the second partial line GLb.

According to an aspect, the gate buffer chip 250 may include first to fourth bumps B1 to B4, and first and second inverters 251 and 253 connected in series to each other.

The first bump B1 is electrically connected to the first partial line GLa to receive a gate pulse from the first partial line GLa. For example, the first bump B1 may be electrically connected to the first partial line GLa through a first bump contact hole CHb1 provided on the first planarization layer 113 overlapping the first partial line GLa.

The second bump B2 is electrically connected to the second partial line GLb and outputs, to the second partial line GLb, gate pulses output from an even number of inverters 251 and 253. For example, the second bump B2 may be electrically connected to the second partial line GLb through a second bump contact hole CHb2 provided on the first planarization layer 113 overlapping the second partial line GLb.

The third bump B3 is electrically connected to its adjacent pixel driving power line PL to receive the pixel driving power Vdd from the pixel driving power line PL. For example, through a third bump contact hole provided on the first planarization layer 113 and an insulating layer 114 overlapping a protrusion electrode PLa protruding from the adjacent pixel driving power line PL, the third bump B3 may be electrically connected to the pixel driving power line PL.

The fourth bump B4 is electrically connected to its adjacent cathode power supply line CPL, and receives cathode power Vss from the cathode power supply line. For example, through a fourth bump contact hole provided on the first planarization layer 113 and an insulating layer 114 overlapping a protrusion electrode CPLa protruding from the adjacent cathode power supply line CPL, the fourth bump B4 may be electrically connected to the cathode power supply line CPL. Optionally, the fourth bump B4 may be directly connected to the cathode electrode CE through the plurality of cathode connecting electrodes CCE as shown in FIG. 5, rather than not being electrically connected to the cathode power supply line CPL, depending on the mounting location of the gate buffer chip 250.

The first inverter 251 logically inverts a gate pulse supplied from the first partial line GLa through the first bump B1 using the pixel driving power Vdd supplied through the third bump B3 and the cathode power Vss supplied through the fourth bump B4 and then outputs the logically inverted gate pulse to the second inverter 253.

The second inverter 253 logically re-inverts the logically inverted gate pulse supplied from the first inverter 251 using the pixel driving power Vdd supplied through the third bump B3 and the cathode power Vss supplied through the fourth bump B4 and then outputs the logically re-inverted gate pulse to the second bump B2.

Additionally, FIG. 11 shows that one gate buffer chip 250 is connected to each of the first to $n^{th}$ gate lines GL1 to GLn, but the present disclosure is not limited thereto. Two or more gate buffer chips 250 may be connected to each of the first to $n^{th}$ gate lines GL1 to GLn on the basis of the entire load of the gate lines GL.

Such a gate buffer chip 250, which is an inverter-type buffer, buffers gate pulses supplied to corresponding gate lines GL1 to GLn using the pixel driving power Vdd and the cathode power Vss. Thus, it is possible to minimize a deviation between polling times of location-specific gate pulses GP of the gate lines GL depending on the entire load of the gate lines GL and prevent a deterioration in image quality due to a load deviation between the gate lines GL. In this case, a buffer built in each of the first to $n^{th}$ gate driving chips 210 may be omitted or have a relatively small size. Accordingly, according to this example, by a gate buffer chip 250 being disposed on each of the gate lines GL disposed on the display area DA, it is possible to decrease the size of each of the first to $n^{th}$ gate driving chips 210 and also to drive gate lines disposed on an ultra-large display panel by using only the first to $n^{th}$ gate driving chips 210.

The gate buffer chip 250 disposed on the display area DA may be connected to the cathode power supply line or the cathode electrode CE to receive the cathode power Vss so that the cathode power Vss supplied to the cathode electrode CE may change depending on the operation of the gate buffer chip 250. However, by stably and uniformly supplying the cathode power Vss to the cathode electrode CE through a plurality of cathode power supply line (CPL in FIG. 5), it is possible to prevent the cathode power Vss applied to the cathode electrode CE from changing according to the operation of the gate buffer chip 250.

Figure 14:
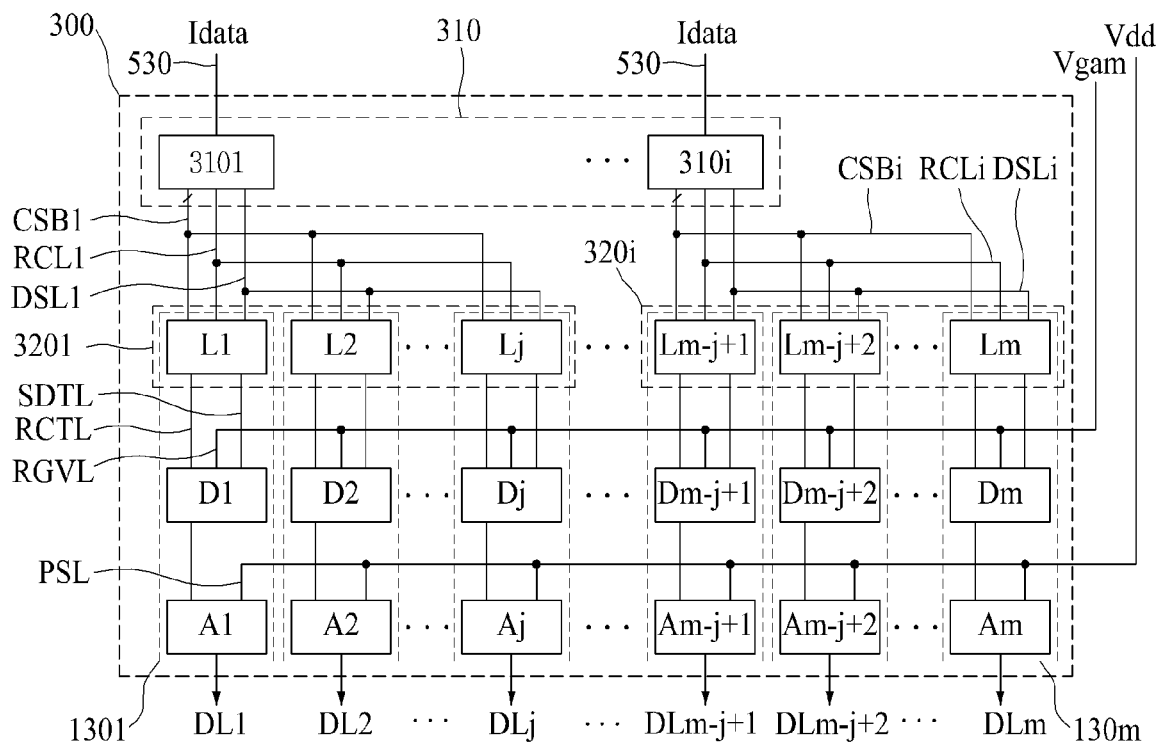
FIG. 14 is a view illustrating a data driving chip array part shown in FIG. 2.

FIG. 14 is a view illustrating the data driving chip array part shown in FIG. 2.

Referring to FIG. 14 in conjunction with FIGS. 1 and 2, the data driving chip array part 300 according to this example may include a data receiving chip array 310, first to $m^{th}$ data latch chips L1 to Lm, first to $m^{th}$ digital-to-analog converter chips D1 to Dm, and first to $m^{th}$ data amp chips A1 to Am. In this case, the first to $m^{th}$ data latch chips L1 to Lm, the first to $m^{th}$ digital-to-analog converter chips D1 to Dm, and the first to $m^{th}$ data amp chips A1 to Am, each of which is a minimum unit of microchip or a single chipset, may be a single small-sized semiconductor packaging device with an integrated circuit including transistors.

The data receiving chip array 310 receives an input digital data signal Idata and outputs at least one horizontal line unit of pixel data. The data receiving chip array 310 receives a digital data signal corresponding to a differential signal transmitted from the timing controller 500 according to a high-speed serial interface scheme, for example, an embedded point to point interface (EPI) scheme, a low-voltage differential signaling (LVDS) interface scheme, or a Mini LVDS interface scheme, generates at least one horizontal line unit of pixel data on the basis of the received digital data signal, and generates a reference clock and a data start signal from the differential signal.

According to an aspect, the data receiving chip array 310 may include first to $i^{th}$ data receiving chips 3101 to 310$i$ (here, i is a natural number greater than or equal to two). In this case, the first to $i^{th}$ data receiving chips 3101 to 310$i$, each of which is a minimum unit of microchip or a single chipset, may be a single small-sized semiconductor packaging device with an integrated circuit including transistors.

Each of the first to $i^{th}$ data receiving chips 3101 to 310$i$ individually receives digital data signals to be supplied to j pixels (where j is a natural number of 2 or greater) among differential signals transmitted from the timing controller 500 through a single interface cable 530, individually generates pixel data to be supplied to the j pixels on the basis of the received digital data signals, and individually generates a reference clock and a data start signal from the differential signals. For example, when the interface cable 530 has first to $i^{th}$ pairs, the first data receiving chip 3101 individually receives digital data signals corresponding to first to $i^{th}$ pixels from the differential signals transmitted from the timing controller through the first pair of the interface cable 530, individually generates pixel data corresponding to the first to $j^{th}$ pixels on the basis of the received digital data signals, and individually generates a reference clock and a data start signal from the differential signals. Also, the $i^{th}$ data receiving chip 310i individually receives digital data signals corresponding to m−j+1$^{th}$ to m$^{th}$ pixels from the differential signals transmitted from the timing controller 500 through the $i^{th}$ pair of the interface cable 530, individually generates pixel data corresponding to the m−j+1$^{th}$ to m$^{th}$ pixels on the basis of the received digital data signals, and individually generates a reference clock and a data start signal from the differential signals.

The first to $i^{th}$ data receiving chips 3101 to 310i individually output pixel data through a serial data communication scheme using first to $i^{th}$ common serial data buses CSB1 to CSBi each having a data bus corresponding to the number of bits of the pixel data, individually output the reference clock to first to $i^{th}$ common reference clock lines RCL1 to RCLi, and individually output the data start signal to first to $i^{th}$ data start signal lines DSL1 to DSLi. For example, the first data receiving chip 3101 may transmit corresponding pixel data, a corresponding reference clock, and a corresponding data start signal through the first common serial data bus CSB1, the first common reference clock line RCL1, and the first data start signal line DSL1. Also, the $i^{th}$ data receiving chip 310i may transmit corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

According to an aspect, the data receiving chip array 310 may be composed of only one data receiving chip. That is, the first to $i^{th}$ data receiving chips 3101 to 310i may be configured as a single integrated data receiving chip.

Each of the first to m$^{th}$ data latch chips L1 to Lm samples and latches (or holds) pixel data transmitted from the data receiving chip array 310 according to the reference clock on the basis of the data start signal, and outputs the received reference clock and the latched pixel data through a serial data communication scheme.

The first to m$^{th}$ data latch chips L1 to Lm may be grouped into first to $i^{th}$ data latch groups 3201 to 320i, each of which consists of j data latch chips.

On a group basis, the data latch chips grouped into the first to $i^{th}$ data latch groups 3201 to 320i are commonly connected to the first to $i^{th}$ common serial data buses CSB1 to CSBi. For example, each of the first to $j^{th}$ data latch chips L1 to Lj grouped into the first data latch group 3201 may receive corresponding pixel data, a corresponding reference clock, and a corresponding start signal through the first common serial data bus CSB1, the first common reference clock line RCL1, and the first data start signal line DSL1. Also, each of m−j+1$^{th}$ to m$^{th}$ data latch chips Lm−j+1 to Lm grouped into the $i^{th}$ data latch group 320i may receive corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

When pixel data having a corresponding number of bits is sampled and latched, each of the first to m$^{th}$ data latch chips L1 to Lm outputs the received reference clock and the latched pixel data through a serial data communication scheme.

According to an aspect, each of the first to m$^{th}$ data latch chips L1 to Lm may include a latch circuit configured to sample and latch pixel data input through a corresponding common serial data bus CSB according to the reference clock in response to the data start signal, a counter circuit configured to count the reference clock and generate a data output signal, and a clock bypass circuit configured to bypass the received reference clock.

The first to m$^{th}$ digital-to-analog converter chips D1 to Dm are connected on a one-to-one basis to the first to m$^{th}$ data latch chips L1 to Lm, and are commonly connected to at least one reference gamma voltage supply line RGVL through which at least one reference gamma voltage Vgam is supplied from a power supply circuit. In this case, one of the digital-to-analog converter chips D1 to Dm is connected to one of the data latch chips L1 to Lm through a single serial data transmission line SDTL and a single reference clock transmission line RCTL. The first to m$^{th}$ digital-to-analog converter chips D1 to Dm receive and parallelize pixel data input from the corresponding data latch chips L1 to Lm through the serial data transmission line SDTL in a serial communication scheme according to the reference clock transmission line RCTL supplied from the corresponding data latch chips L1 to Lm. Then, the first to m$^{th}$ digital-to-analog converter chips D1 to Dm convert parallel pixel data into data voltages on the basis of reference gamma voltages supplied through the reference gamma voltage supply line RGVL and output the data voltages.

According to an aspect, each of the first to m$^{th}$ digital-to-analog converter chips D1 to Dm may include a data parallelization circuit configured to receive and parallelize pixel data input in a serial data communication scheme, according to a reference clock, a grayscale voltage generating circuit configured to distribute reference gamma voltages and generate a plurality of grayscale voltages corresponding to a plurality of grayscale values according to the number of bits of the pixel data, a clock counter configured to count the reference clock to generate a parallel data output signal, and a grayscale voltage selection unit configured to select, as a data voltage, one grayscale voltage corresponding to a grayscale value of parallel pixel data from among the plurality of grayscale voltages.

Optionally, the grayscale voltage generating circuit of each of the first to m$^{th}$ digital-to-analog converter chips D1 to Dm may distribute the pixel driving voltages Vdd supplied from the power management circuit 600 instead of the reference gamma voltages to generate a plurality of different grayscale voltages. In this case, the at least one reference gamma voltage supply line RGVL disposed in the non-display area of the substrate is omitted, and thus it is possible to increase space utilization of the non-display area of the substrate According to this example, by receiving pixel data from the data latch chips L1 to Lm in a serial data communication scheme, the first to m$^{th}$ digital-to-analog converter chips D1 to Dm has a minimum number of terminals for receiving the pixel data and thus may be decreased in size. As the number of data transmission lines between the digital-to-analog converter chips D1 to Dm and the data latch chips L1 to Lm increases, it is possible to increase the space utilization of the non-display area of the substrate.

The first to $m^{th}$ data amp chips A1 to Am are connected on a one-to-one basis to the first to $m^{th}$ digital analog converter chips D1 to Dm, and are connected on a one-to-one basis to the first to $m^{th}$ data lines DL1 to DLm. Also, the first to $m^{th}$ data amp chips A1 to Am are commonly connect to a pixel driving voltage supply line PSL through which the pixel driving voltage Vdd is supplied from the power management circuit 600 and are commonly connected to a ground voltage line through which a ground voltage is supplied from the power supply circuit 600. The first to $m^{th}$ data amp chips A1 to Am buffer data voltages supplied from the corresponding digital-to-analog converter chips D1 to Dm on the basis of the pixel driving voltages Vdd, and supply the buffered data voltages to the corresponding data lines DL1 to DLm. For example, each of the first to $m^{th}$ data amp chips A1 to Am may buffer and output a data voltage on the basis of a gain value set according to a line load of a data line.

Additionally, one data receiving chip, one data latch chip, and one digital-to-analog conversion chip for supplying data voltage to one data line constitute each of the data driving chip groups 1301 to 130m, which may be configured as a single data driving chip. In this case, the number of chips connected to each of the first to $m^{th}$ data lines DL1 to DLm may decrease by a factor of ⅓.

The data driving chip array part 300 according to this example is mounted in the non-display area of the substrate to covert digital data input from the outside into a data voltage and supply the data voltage to the data lines DL1 to DLm. Accordingly, it is possible to omit a source printed circuit board and flexible circuit films provided in the display apparatus and thus to simplify the configuration of the display apparatus. Also, according to this example, by applying serial data communication between the data latch chips L1 to Lm and the digital-to-analog converters D1 to Dm, it is possible to decrease the number of terminals of each of the data latch chips L1 to Lm and the digital-to-analog converters D1 to Dm, facilitate fabrication of each of the data latch chips L1 to Lm and the digital-to-analog converters D1 to Dm as a microchip, and decrease a region of the substrate occupied by the data driving chip array part 300 in the non-display area of the substrate to minimize an increase in bezel width of the display apparatus caused by mounting the data driving chip array part 300 on the substrate.

Figure 15:
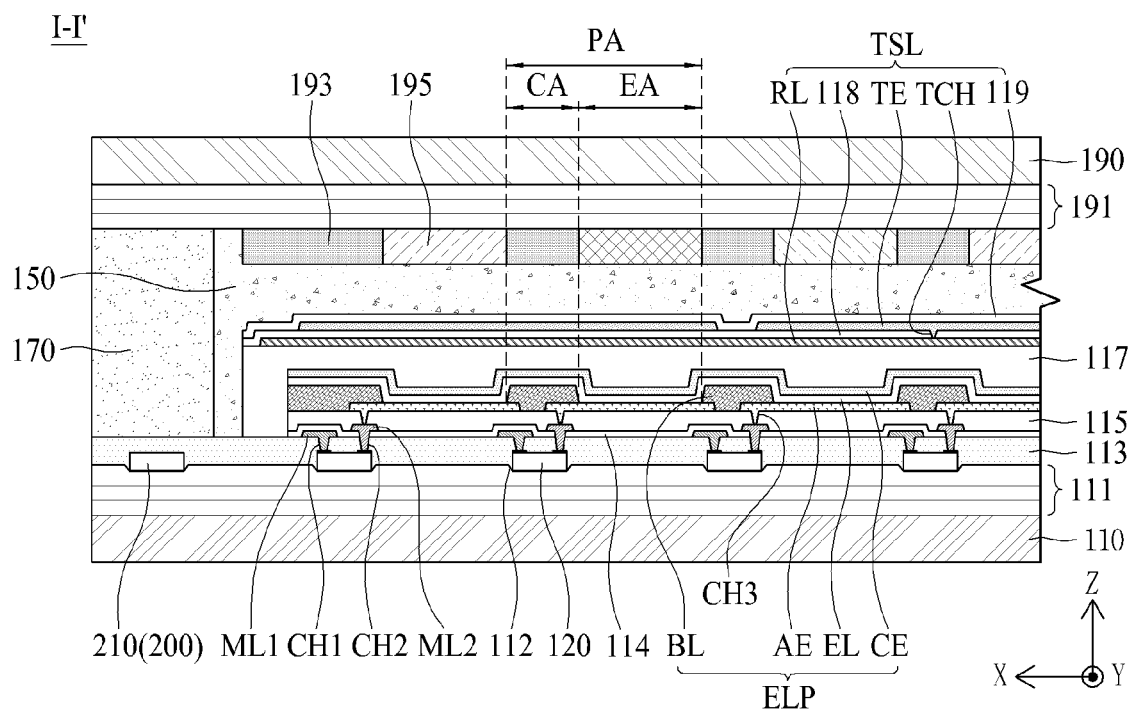
FIG. 15 is still another cross-sectional view taken along line I-I' shown in FIG. 1.
Figure 16:
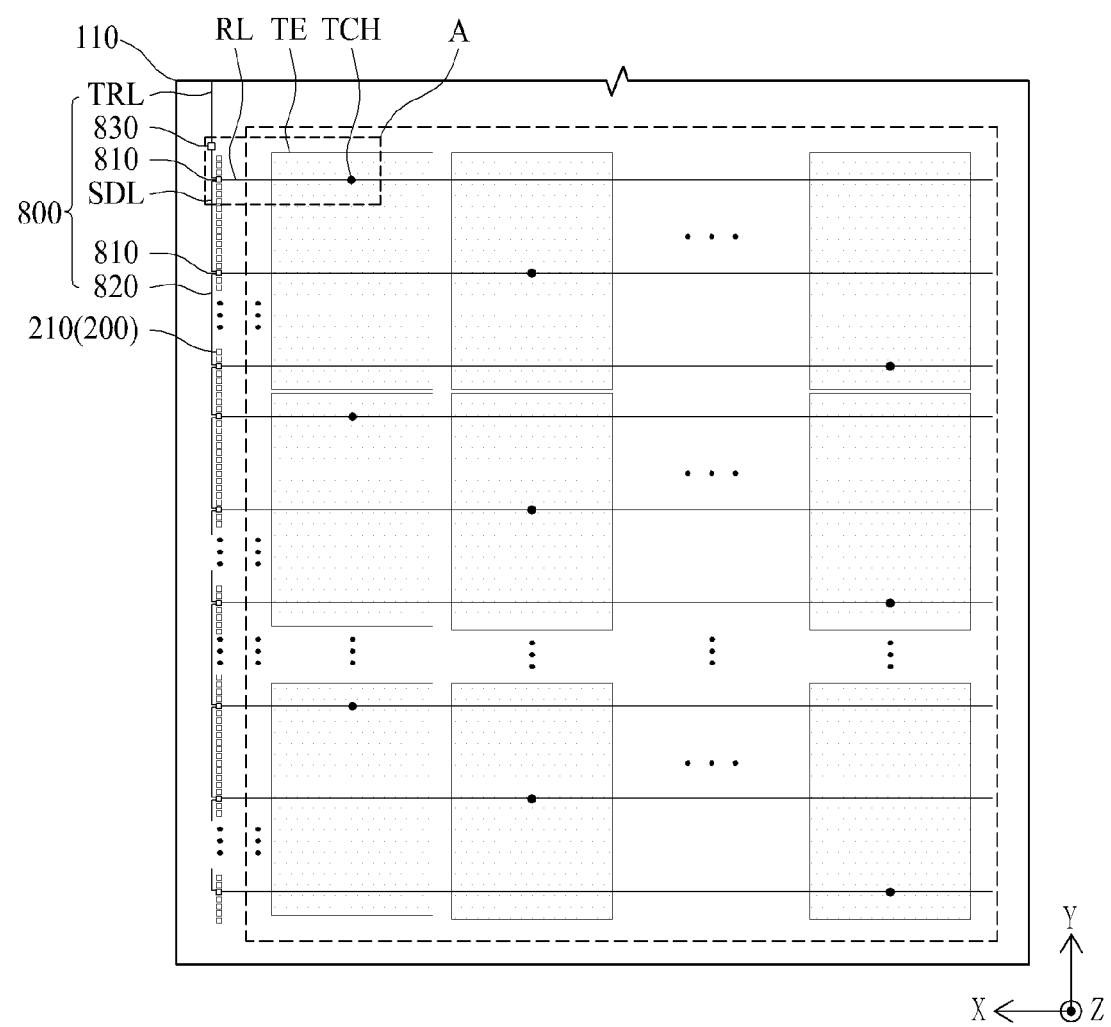
FIG. 16 is a view showing a touch sensing chip array part, a gate driving chip array part, and a touch electrode shown in FIG. 15.
Figure 17:
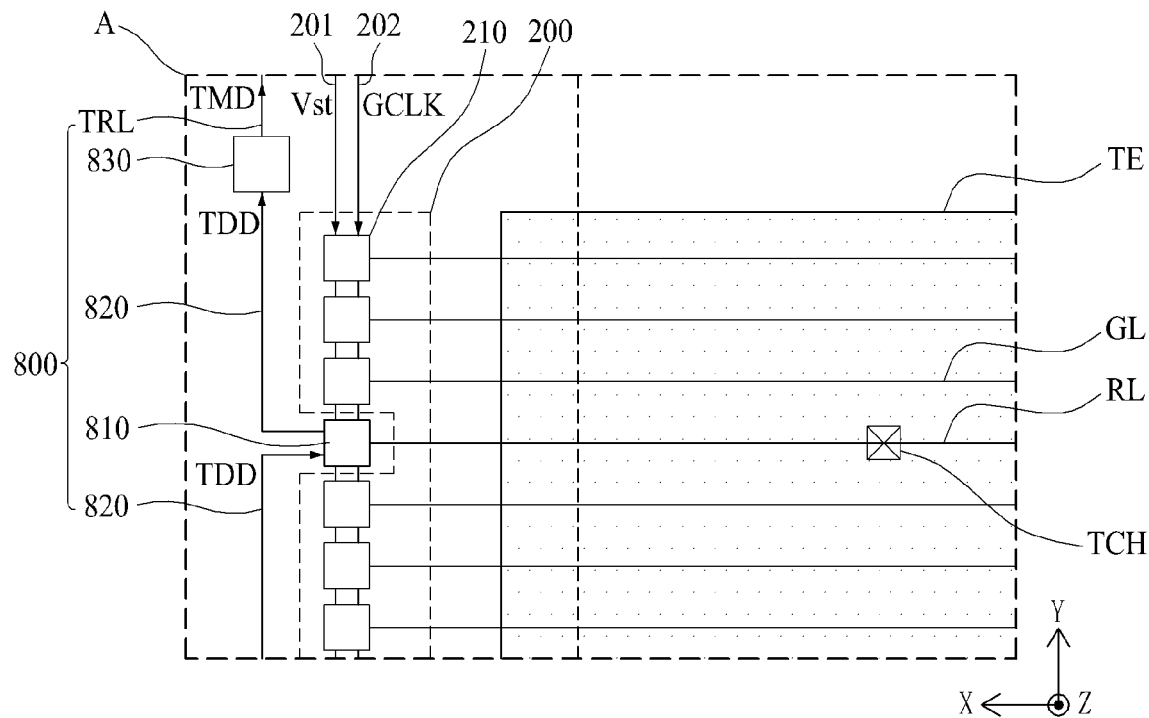
FIG. 17 is an enlarged view of a portion A shown in FIG. 16.
Figure 18:
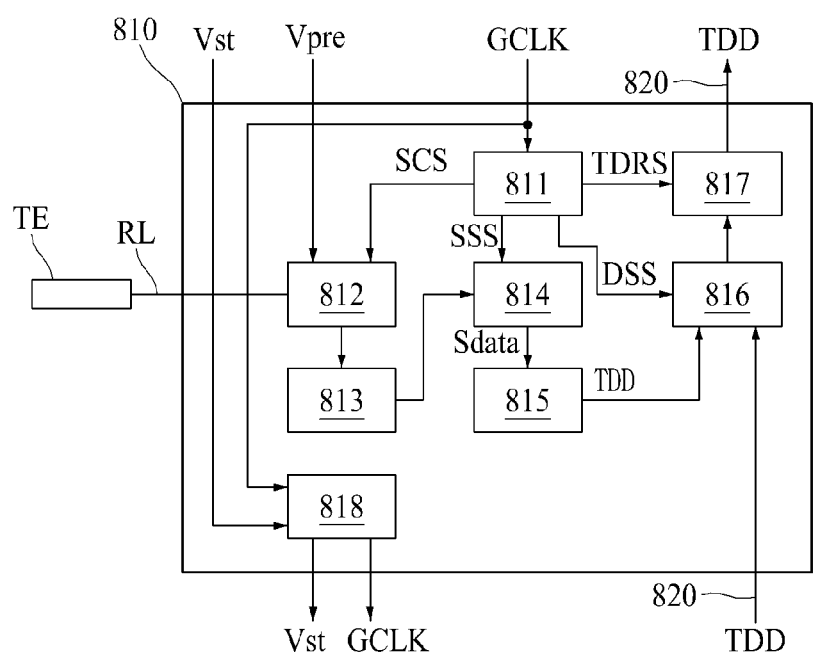
FIG. 18 is a view illustrating a touch sensing chip shown in FIGS. 16 and 17.

FIG. 15 is still another cross-sectional view taken along line I-I' shown in FIG. 1, FIG. 16 is a view showing a touch sensing chip array part, a gate driving chip array part, and a touch electrode shown in FIG. 15, FIG. 17 is an enlarged view of a portion A shown in FIG. 16, and FIG. 18 is a view illustrating a touch sensing chip shown in FIGS. 16 and 17. This is configured by adding a touch electrode and a touch sensing chip array part to the display panel of the display apparatus shown in FIGS. 1 to 14. Thus, only the touch electrode, the touch sensing chip array part, and their associated elements will be described below, and a repetitive description of the remaining elements will be omitted.

Referring to FIGS. 15 to 18 in conjunction with FIGS. 1 and 2, the display apparatus according to this example may further include a touch sensor layer TSL having a plurality of touch electrodes TE and a plurality of touch routing lines RL and a touch sensing chip array part 800.

Each of the plurality of touch electrodes TE may be disposed on the sealing layer 117 disposed on the substrate 110 and may serve as a touch sensor for sensing a touch made by a touch object, and thus may be formed of a transparent conductive material. In this case, the touch object may be defined as a user's finger or a touch pen such as an active stylus pen.

According to an aspect, each of the plurality of touch electrodes TE may have a rectangular, octagonal, circular, or rhombic shape.

The plurality of touch routing lines RL may be individually connected to the plurality of touch electrodes TE. According to an aspect, each of the plurality of touch routing lines RL may be disposed on the front surface of the sealing layer 117 to overlap the bank layer BL. For example, the plurality of touch routing lines RL may be disposed to pass through the display area in the first direction X.

The plurality of touch routing lines RL may be covered with a touch insulating layer 118. Thus, the plurality of touch routing lines RL may be disposed below the plurality of touch electrodes and covered with the touch insulating layer 118.

The touch insulating layer 118 may be directly formed on the front surface of the sealing layer 117 to cover to the plurality of touch routing lines RL. The touch insulating layer 118 may be formed of an organic material or an inorganic material. When the touch insulating layer 118 may be formed of an organic material, the touch insulating layer 118 may be provided through a process of coating the sealing layer 117 with the organic material and a process of curing the organic material at a temperature of 100 degrees Celsius or less. When the touch insulating layer 118 may be formed of an inorganic material, the touch insulating layer may be provided by an inorganic material that is deposited on the sealing layer 117 through a low temperature chemical vapor deposition and a cleaning process which are alternately performed two or more times.

Since each of the plurality of touch electrodes TE is used as a self-capacitance type touch sensor, each touch electrode TE should have a size greater than a minimum contact area between a touch object and the display panel 100. Thus, each of the plurality of touch electrodes TE may be formed on the touch insulating layer 118 to have a size corresponding to one or more pixels P and may be electrically connected to a corresponding touch routing line RL through a touch contact hole TCH provided in the touch insulating layer 118 overlapping the corresponding touch routing line RL.

As an example, the plurality of touch electrodes TE may be arranged at regular intervals in the first direction X and the second direction Y. For example, one touch electrode TE may overlap 30 pixels P arranged in the first direction X and 30 pixels P arranged in the second direction Y, but the present disclosure is not limited thereto, and may be changed depending on a resolution and/or a touch resolution of the display apparatus.

The plurality of touch electrodes TE may be covered by the protective layer 119. The protective layer 119 is formed on the plurality of touch electrodes TE and the touch insulating layer 118 to cover the plurality of touch electrode TE. Optionally, it is possible to omit the protective layer 119. In this case, the plurality of touch electrodes TE may covered by a transparent adhesive layer 150.

In the display apparatus according to this example, a black matrix and a color filter layer may be disposed on the front surface of the sealing layer 117, as shown in FIG. 6. In this case, the black matrix and the color filter layer may be disposed between the sealing layer 117 and the touch sensor layer TSL including the plurality of touch routing line RL, the touch insulating layer 118, and the plurality of touch electrodes TE or disposed between the touch sensor layer TSL and the opposite substrate 190.

Figure 19:
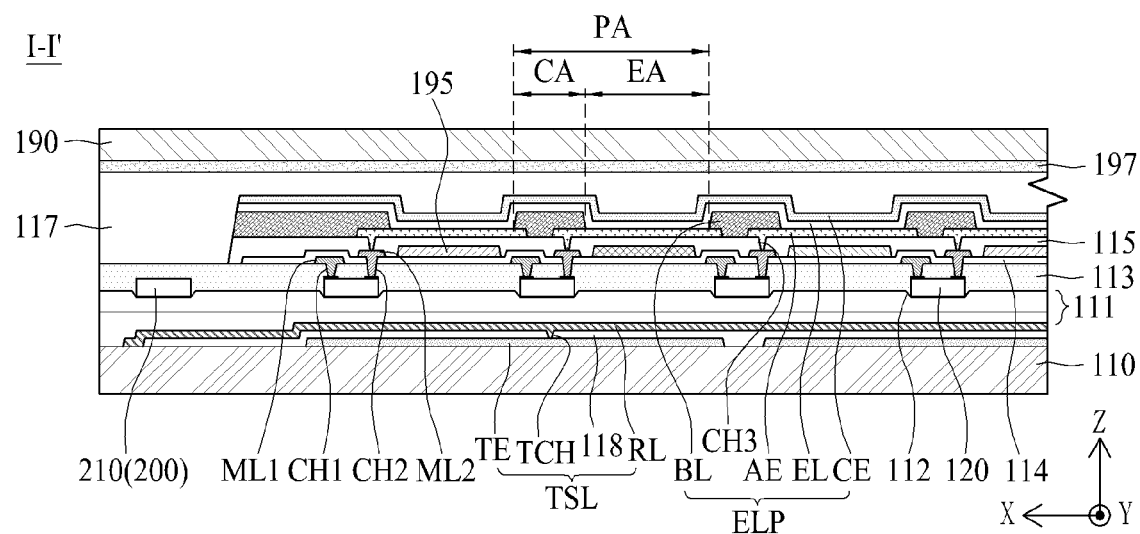
FIG. 19 is still another cross-sectional view taken along line I-I' shown in FIG. 1.

Optionally, the touch sensor layer TSL according to another aspect may be disposed between the substrate 110 and the buffer layer 111, as shown in FIG. 19. In this case, the plurality of touch electrodes TE may be disposed on the substrate 110 and covered by the touch insulating layer 118, and each of the plurality of touch routing lines RL may be disposed on the touch insulating layer 118 and electrically connected to a corresponding touch electrode TE through the touch contact hole TCH. The touch sensor layer TSL may be covered by the buffer layer 111. When the touch sensor layer TSL is disposed between the substrate 110 and the buffer layer 111, light emitted by the light emitting layer EL of each pixel may be emitted to the outside through the anode electrode AE, which is formed of a transparent conductive material, the color filter layer 195, the touch sensor layer TSL, and then the substrate 110 in sequence, but the present disclosure is not limited thereto. The light emitted by the light emitting layer EL of each pixel may be emitted to the outside through the transparent cathode electrode CD, the sealing layer 117, the color filter layer 195, and the opposite substrate 190 according to the structure shown in FIG. 15.

Referring to FIGS. 15 to 18 in conjunction with FIGS. 1 and 2, the touch sensing chip array part 800 may be mounted in the non-display area of the substrate 110 and may be connected to the plurality of touch electrodes TE through the plurality of touch routing lines RL. The touch sensing chip array part 800 senses a change in capacitance of each of the plurality of touch electrodes TE, generates touch information regarding a touch object, and provides the touch information to the timing controller 500 or the display driving system 700. Thus, the timing controller 500 or the display driving system 700 may execute an application corresponding to the touch information.

According to an aspect, the touch sensing chip array part 800 may include a plurality of touch sensing chips 810 and a touch processing chip 830.

Each of the plurality of touch sensing chips 810 is disposed between any two of the first to $n^{th}$ gate driving chips 210 and connected to a corresponding touch electrode TE through a corresponding touch routing line RL to output touch presence data based on a change in capacitance of the corresponding touch electrode TE.

According to a gate start signal Vst supplied through a gate start signal line 201 and a gate clock GCLK supplied through a single gate clock line 202, each of the first to $n^{th}$ gate driving chips 210 outputs a gate pulse to a gate line GL corresponding to the gate start signal and supplies the gate clock GCLK and the gate pulse to a gate driving chip or a touch sensing chip disposed at the next stage as the gate start signal Vst.

Each of the plurality of touch sensing chips 810 receives the gate start signal Vst and the gate clock GCLK from a gate driving chip 210 disposed at the previous stage, generates touch presence data TDD based on a change in capacitance of a corresponding touch electrode TE according to the gate clock GCLK and provides the touch presence data TDD to the touch processing chip 830, and then supply the gate clock GCLK and the gate start signal Vst to a gate driving chip 210 disposed at the next stage. At the previous stage and the next stage of each of the plurality of touch sensing chips 810, a gate driving ship 210 is disposed. Also, the plurality of touch sensing chips 810 are connected in cascade to one another by a plurality of touch data transmission lines 820 for serial data transmission of the touch presence data.

According to an aspect, each of the plurality of touch sensing chips 810 may include a sensing timing control circuit 811, a switching part 812, a sensing integration circuit 813, an analog-to-digital conversion circuit 814, a comparison circuit 815, a selection circuit 816, and a first-in first-out (FIFO) memory 817.

The sensing timing control circuit 811 may generate a sensing switch control signal SCS, a sensing sampling signal SSS, a data selection signal DSS, and a touch data report signal TDRS on the basis of the gate clock GCLK. For example, the sensing timing control circuit 811 may generate a sensing switch control signal SCS, a sensing sampling signal SSS, a data selection signal DSS, and a touch data report signal TDRS by counting the gate clock GCLK according to a number counted based on a predetermined sensing timing.

The switching part 812 supplies a pre-charging voltage Vpre to a touch electrode TE through a corresponding touch routing line RL in response to the sensing switch control signal SCS to pre-charge the capacitance of the touch sensor and connects a pre-charged corresponding touch routing line RL to the sensing integration circuit 813. In this case, the switching part 812 may receive a pixel driving voltage and use the received pixel driving voltage as the pre-charging voltage Vpre, but the present disclosure is not limited thereto. The switching part 812 may directly receive the pre-charging voltage Vpre from the power management circuit 600 through a separate power supply line, instead of the pixel driving voltage.

The sensing integration circuit 813 is selectively connected to a corresponding touch routing line RL depending on switching of the switching part 812 to accumulate the change in capacitance of the touch electrode TE in a sensing capacitor at least once.

The analog-to-digital conversion circuit 814 converts the capacitance accumulated in the sensing capacitor into digital sensing data Sdata and then outputs the digital sensing data Sdata in response to the sensing sampling signal SSS.

The comparison circuit 815 generates the touch presence data TDD by comparing the digital sensing data Sdata supplied from the analog-to-digital conversion circuit 814 to reference data. For example, the comparison circuit 815 may generate touch presence data TDD with a digital value of "0" when the digital sensing data Sdata is smaller than the reference data and may generate touch presence data TDD with a digital value of "1" when the digital sensing data Sdata is larger than or equal to the reference data. In this case, the touch presence data TDD may consist of digital data of one bit.

The selection circuit 816 selectively outputs the touch presence data TDD supplied from the comparison circuit 815 or the touch presence data TDD transmitted from the touch sensing chip 810 disposed at the next stage through the touch data transmission line 820, depending on the data selection signal DSS. For example, the selection circuit 816 may include a control terminal for receiving the data selection signal DSS, a first input terminal connected to an output terminal of the comparison circuit 815, and a second input terminal connected to the touch data transmission line 820. The selection circuit 816 may output the touch presence data TDD received through the first input terminal according to a data selection signal DSS with a first logical state and may output the touch presence data TDD transmitted from the touch sensing chip positioned at the next stage through the second input terminal according to a data selection signal DSS with a second logical state.

The FIFO memory 817 stores the touch presence data TDD supplied from the selection circuit 816 in a FIFO scheme and outputs the stored touch presence data TDD in the FIFO scheme according to the touch data report signal TDRS.

In addition, each of the plurality of touch sensing chips 810 may further include a signal transmission circuit 818 configured to transmit the received gate start signal Vst and gate clock GCLK to the gate driving chip 210 disposed at the next stage. The signal transmission circuit 811 may include a buffer circuit configured to buffer and output the gate start signal Vst and the gate clock GCLK.

The touch processing chip 830 collects the touch presence data TDD provided by the plurality of touch sensing chips 810, generates touch map data TMD, and provides the generated touch map data TMD through a touch report line TRL to the display driving system. Thus, the display driving system 700 receives the touch map data TMD provided by the touch processing chip 830 and executes an application corresponding to the touch information.

According to an aspect, the touch processing chip 830 may be connected to a first touch sensing chip 810 through the touch data transmission line 820. Also, the touch processing chip 830 may sequentially collect touch presence data of each of the plurality of touch sensing chips 810 transmitted via at least one touch sensing chip 810 according to FIFO data transmission between the plurality of touch sensing chips 810 according to a touch data report signal corresponding to the gate clock GCLK and may generate the touch map data TMD on the basis of the touch presence data collected for all the touch electrodes when the touch presence data generated by the last touch sensing chip 810 is also collected in the FIFO scheme.

According to this example, by operating the touch sensing chip array part 800 in coordination with the gate driving chip array part 200, it is possible to decrease the numbers of lines and terminals for driving the touch sensing chip array part 800. Thus, it is possible to implement the touch sensing chip 810 as a microchip, significantly decrease an area occupied by the touch sensing chip array part 800 in the non-display area of the substrate, and minimize an increase in bezel width of the display apparatus caused by mounting the touch sensing chip array part 800 on the substrate.

By sharing the gate clock GCLK for operation of the gate driving chip array part 200, the touch sensing chip array part 800 may sense a touch without a separate touch driving signal. However, the gate clock GCLK may have 1 horizontal period. Thus, it is possible to reduce touch sensitivity due to a relatively low touch sensing frequency based on the gate clock GCLK when a touch is sensed.

In order to prevent a reduction in touch sensitivity, the above-described timing controller may generate a second gate clock having a period at least two times faster than a predetermined reference period of a first gate clock and provide the second gate clock to the gate driving chip array part 200, each of the first to $n^{th}$ gate driving chips 210 may restore the second gate clock back to the first gate clock and use the first gate clock, and the touch sensing chip array part 800 may perform a touch sensing operation using the second gate clock. For example, when the second gate clock has a frequency 10 times higher than the first gate clock, each of the first to $n^{th}$ gate driving chips 210 may include a clock restoration circuit configured to receive the second gate clock and provide the second gate clock to a shift register configured to restore the second gate clock back to the first gate clock. In this case, the second gate clock input to each of the first to $n^{th}$ gate driving chips 210 is delivered to the touch sensing chip 810 or the gate driving chip disposed at the next stage as the second gate clock is input to the clock restoration circuit.

As described above, according to an aspect of the present disclosure, by implementing a data driving circuit and a gate driving circuit for driving each pixel of the display panel 100 as a microchip and mounting the microchip on the substrate 110, there is no need for a process of forming at least one transistor for each pixel of a general display panel. Also, since no transistor is disposed or formed on the substrate 110 of the display panel, it is possible to prevent quality deterioration due to luminance unevenness caused by threshold voltage deviation of a driving transistor occurring between pixels.

Figure 20:
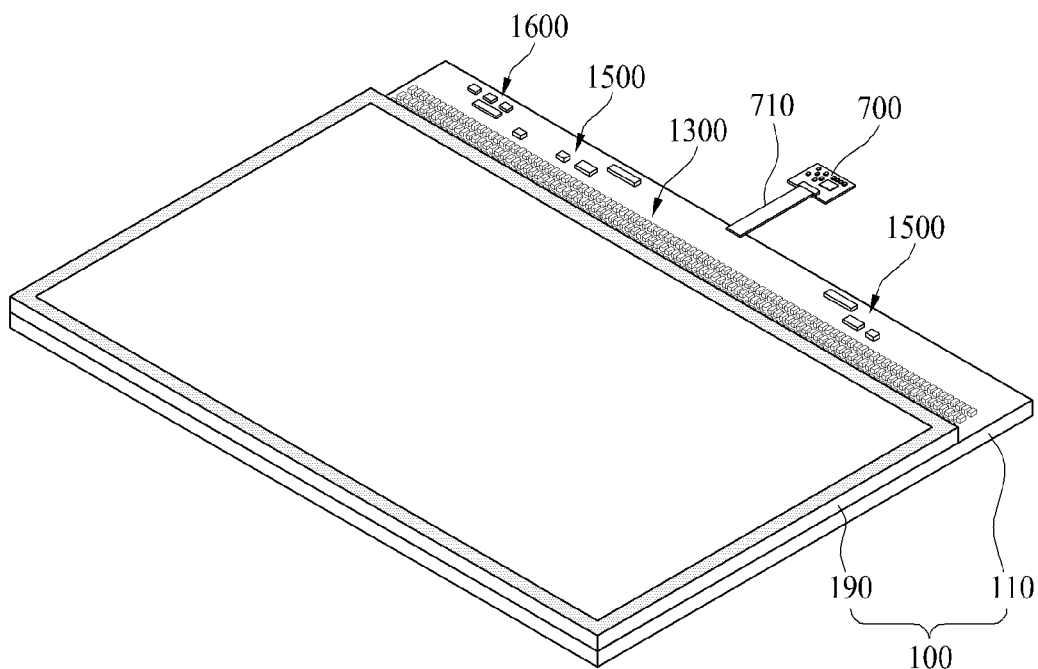
FIG. 20 is a view illustrating a display apparatus according to another aspect of the present disclosure.
Figure 21:
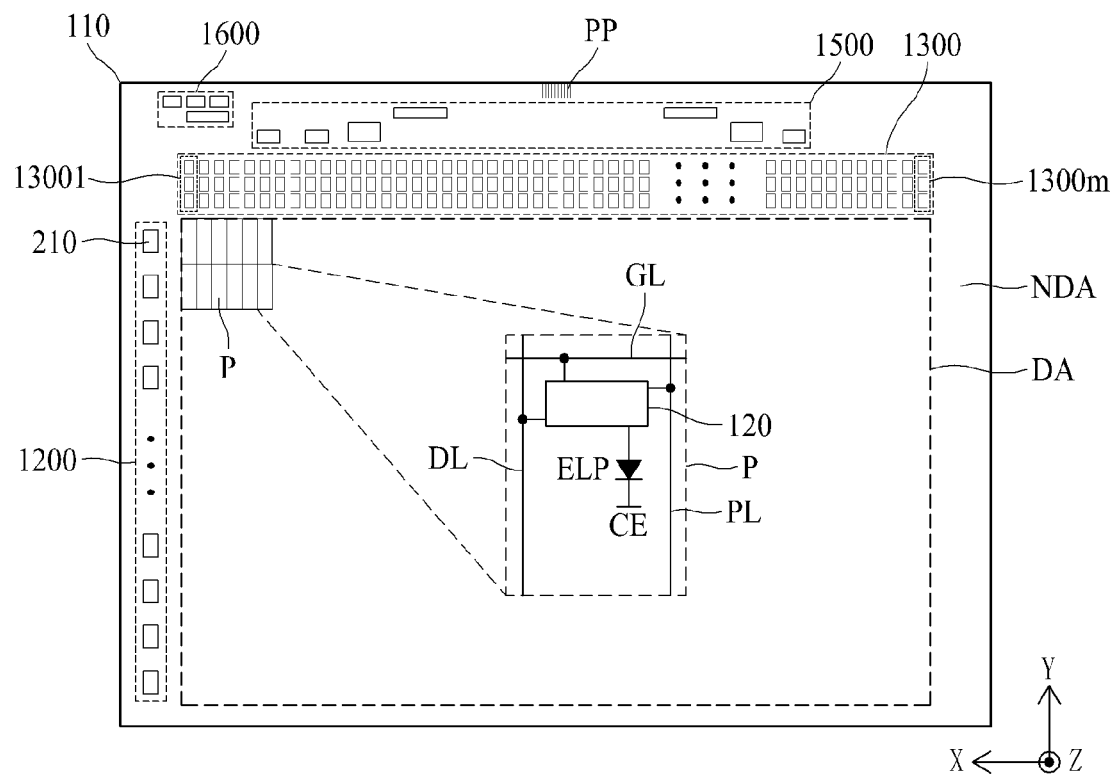
FIG. 21 is a view illustrating a substrate shown in FIG. 20.

FIG. 20 is a view illustrating a display apparatus according to another aspect of the present disclosure, and FIG. 21 is a view illustrating a substrate shown in FIG. 20. In the figures, the timing controller and the power management circuit of the display apparatus shown in FIGS. 1 to 19 are implemented as a microchip and mounted on the substrate of the display panel.

Referring to FIGS. 20 and 21, the display apparatus according to another aspect of the present disclosure may include a display panel 100, a gate driving chip array part 1200, a data driving chip array part 1300, a timing controller chip array part 1500, and a power management chip array part 1600.

The display panel 100 may include a substrate 110 and an opposite substrate 190 and is the same as the display panel of the display apparatus according to an aspect of the present disclosure. Thus, the same reference numeral is assigned to the display panel 100, and a repetitive description thereof will be omitted.

The gate driving chip array part 1200, the data driving chip array part 1300, the timing controller chip array part 1500, and the power management chip array part 1600 are mounted on the first substrate 110 of the display panel 100 through a chip bonding process or a chip transfer process.

The gate driving chip array part 1200 may include first to $n^{th}$ gate driving chips 210 mounted in the non-display area NDA of the substrate 110 and connected to the first to $n^{th}$ gate lines GL. The gate driving chip array part 1200 including the first to $n^{th}$ gate driving chips 210 is the same as the gate driving chip array part 200 of the display apparatus according to an aspect of the present disclosure, except that the gate driving chip array part 1200 sequentially supplies gate pulses to the gate lines GL in response to the gate start signal and gate clock that are directly supplied from the timing controller chip array part 1500 mounted on the substrate 110, and a repetitive description thereof will be omitted.

The data driving chip array part 1300 may be mounted in a first non-display area (or an upper non-display area) of the substrate 110 to convert pixel data supplied from the timing controller chip array part 1500 into a data voltage and may supply the data voltage to a corresponding one of the first to $n^{th}$ data lines DL. For example, the data driving chip array part 1300 may include a plurality of data driving chips mounted in the first non-display area, which is defined between the display area DA and the pad part PP of the substrate 110, to supply a corresponding data voltage to each of the first to $m^{th}$ data lines DL.

The timing controller chip array part 1500 may be mounted in the first non-display area to generate a digital data signal on the basis of an image signal (or a differential signal) supplied from the display driving system 700 through the pad part PP, may provide the digital data signal to the data driving chip array part 1300, and may provide the gate clock and the gate start signal to the gate driving chip array part 1200. That is, the timing controller chip array part 1500 may receive the differential signal input through the pad part PP and may generate a frame-based digital data signal, reference clock, and data start signal from the differential signal. Also, the timing controller chip array part 1500 may perform image processing for image quality improvement on the digital data signal in units of frames, may segment the frame-based digital data signal in units of at least 1 horizontal line, and may provide the segmented digital data signals to the data driving chip array part 1300. Also, the timing controller chip array part 1500 may generate the gate start signal and the gate clock on the basis of the reference clock and may provide the generated gate start signal and gate clock to the gate driving chip array part 1200.

The power management chip array part 1600 may be mounted in the non-display area of the substrate 110 and may output various kinds of voltages for displaying an image to each pixel P of the display panel 100 on the basis of input power supplied from the display driving system 700 through the pad part PP disposed in the substrate 110. According to an aspect, the power management chip array part 1600 may generate a transistor logic voltage, pixel driving power, cathode power, and at least one reference gamma voltage on the basis of the input power.

Figure 22:
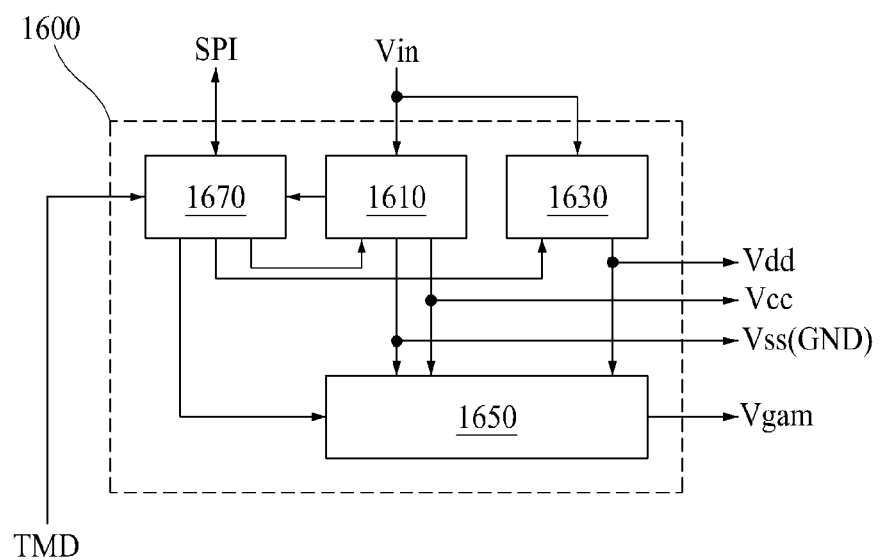
FIG. 22 is a block diagram illustrating a power management chip array part shown in FIGS. 20 and 21.

FIG. 22 is a block diagram illustrating the power management chip array part shown in FIGS. 20 and 21.

Referring to FIG. 22 in conjunction with FIGS. 20 and 21, the power management chip array part 1600 of the display apparatus according to this example may include a DC-DC converter chip array part mounted in the non-display area NDA of the substrate 110 to perform DC-DC conversion on input power Vin, which is received from the outside, and output the converted input power.

The DC-DC converter chip array part may include a logic power chip 1610, a driving power chip 1630, and a gamma voltage generating chip 1650. In this case, the logic power chip 1610, the driving power chip 1630, and the gamma voltage generating chip 1650, each of which is a minimum unit of microchip or a single chipset, may be a single small-sized semiconductor packaging device with an integrated circuit including transistors.

The logic power chip 1610 may generate a transistor logic voltage Vcc based on the input power Vin and may provide the transistor logic voltage Vcc to a microchip that requires the transistor logic voltage Vcc. For example, the logic power chip 1610 may decrease (step down) the input power Vin to generate a transistor logic voltage Vcc of 3.3V. Also, the logic power chip 1610 may generate a ground voltage GND based on the input power Vin and may provide the ground voltage GND to a microchip that requires the ground voltage GND. In this case, the ground voltage GND may be used as cathode power Vss supplied to the cathode electrode CE disposed on the display panel 100. According to an aspect, the logic power chip 1610 may be a DC-DC converter, for example, a step-down converter chip or a buck converter chip, but the present disclosure is not limited thereto.

The driving power chip 1630 may generate pixel driving power Vdd based on the input power Vin and may provide the pixel driving power Vdd to each pixel P and a microchip that require the pixel driving power Vdd. For example, the driving power chip 1630 may generate pixel driving power Vdd of 12V. According to an aspect, the driving power chip 1630 may be a DC-DC converter, for example, a step-up converter chip or a boost converter chip, but the present disclosure is not limited thereto.

The gamma voltage generating chip 1650 may receive the transistor logic voltage Vcc from the logic power chip 1610, may receive the pixel driving power Vdd from the driving power chip 1630, may generate at least one reference voltage Vgam, and may provide the reference gamma voltage Vgam to the data driving chip array part 1300. For example, through voltage distribution using a plurality of voltage divider resistors connected in series between a low potential terminal to which the transistor logic voltage Vcc is to be supplied and a high potential terminal to which the pixel drive power supply Vdd is to be supplied, the gamma voltage generating chip 1650 may output, as the reference gamma voltage Vgam, a distribution voltage of a voltage distribution node between the plurality of voltage divider resistors.

The power management chip array part 1600 according to this example may further include a serial communication chip 1670. In this case, the serial communication chip 1670, which is a minimum unit of microchip or a single chipset, may be a single small-sized semiconductor packaging device with an integrated circuit including transistors.

The serial communication chip 1670 may be connected to the display driving system 700 through a connector attached to a serial communication pad disposed at a side of the non-display area of the substrate 110, separately from the pad part PP disposed on the substrate 110. The serial communication chip 1670 receives a voltage tuning signal supplied from the display driving system 700 through a serial peripheral interface (SPI), restores the received voltage tuning signal back to voltage tuning data, and delivers the voltage tuning data to the DC-DC converter chip array part. For example, the voltage tuning signal may be a signal for tuning a gamma voltage. In this case, the voltage tuning data corresponding to the voltage tuning signal may be provided to the gamma voltage generating chip 1650, and the gamma voltage generating chip 1650 may tune a voltage level of the pixel driving power Vdd supplied to the high potential terminal or tune resistance of at least one of the plurality of voltage divider resistors depending on the voltage tuning data.

Additionally, the serial communication chip 1670 may transmit, to the display driving system 700, touch map data TMD provided from the touch processing chip 830 of the touch sensing chip array part 800 shown in FIGS. 16 and 17. In this case, the touch map data TMD generated by the touch processing chip 830 may be transmitted to the display driving system 700 without a separate touch data transmission signal cable. That is, according to another aspect of the present disclosure, by mounting the power management chip array part 1600 having the serial communication chip 1670 on the substrate 110 and sharing the serial communication chip 1670 between the power management chip array part 1600 and the touch sensing chip array part 800, it is possible to remove a separate signal cable for transmitting the touch map data TMD to the display driving system 700 and thus to further simplify the configuration of the display apparatus. Unlike this, according to another aspect of the present disclosure, in order to transmit the touch map data TMD to the display driving system 700, a touch data transmission chip may be mounted on the substrate 110 and configured for the touch sensing chip array part 800, and the touch sensing chip array part 800 and the power management chip array part 1600 may be configured to share the touch data transmission chip.

Figure 23:
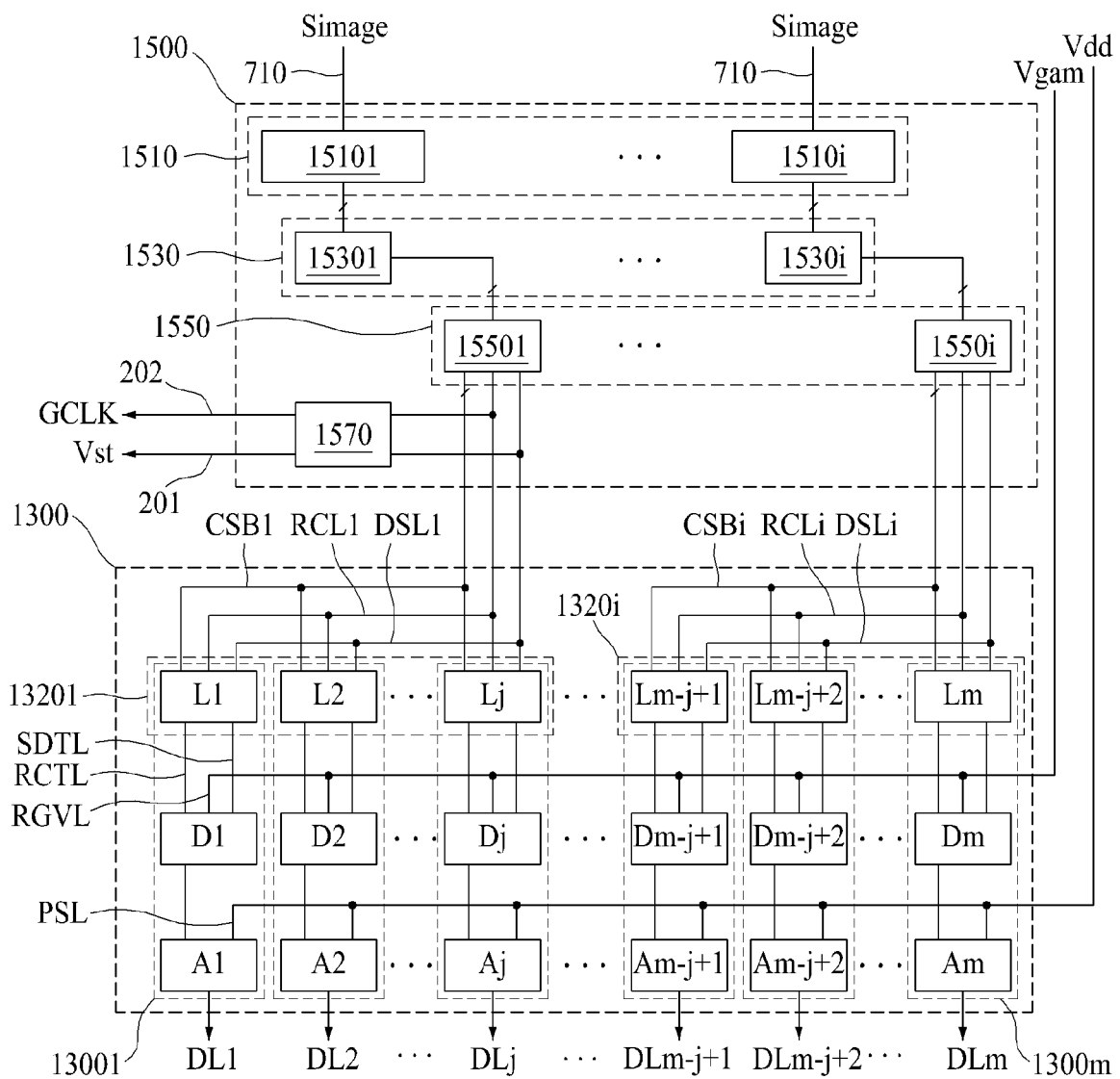
FIG. 23 is a view showing a timing controller chip array part and a data driving chip array part shown in FIGS. 20 and 21.

FIG. 23 is a view showing the timing controller chip array part and the data driving chip array part shown in FIGS. 20 and 21.

Referring to FIG. 23 in conjunction with FIGS. 20 and 21, the timing controller chip array part 1500 of the display apparatus according to this example may include an image signal receiving chip array 1510, an image quality improvement chip array 1530, a data control chip array 1550, and a gate control chip 1570.

The image signal receiving chip array 1510 may generate a digital data signal, a reference clock, and a data start signal in one frame on the basis of an image signal Simage input from the display driving system 700 through the pad part PP. In this case, the image signal Simage may be provided to the image signal receiving chip array 1510 through a high-speed serial interface scheme, for example, a V-by-One interface scheme. In this case, the image signal receiving chip array 1510 may receive a digital data signal corresponding to a differential signal for the image signal input from the display driving system 700 through the V-by-One interface scheme, may generate pixel data of at least one horizontal line unit on the basis of the received digital data signal, and may generate a reference clock and a data start signal from the differential signal.

According to an aspect, the image signal receiving chip array 1510 may include first to $i^{th}$ image signal receiving chips 15101 to 1510$i$ (here, i is a natural number greater than or equal to two). In this case, the first to $i^{th}$ image signal receiving chips 15101 to 1510$i$, each of which is a minimum unit of microchip or a single chip set, may be a single small-sized semiconductor packaging device with an integrated circuit including transistors.

In order to perform synchronization and data communication between the first to $i^{th}$ image signal receiving chips 15101 to 1510$i$, the first image signal receiving chip 15101 may be programmed as a master to control overall operations and functions in the image signal receiving chip array 1510, and each of the second to $i^{th}$ image signal receiving chips 15102 to 1510$i$ may be programmed as a slave to operate in synchronization with the first image signal receiving chip 15101.

Each of the first to $i^{th}$ image signal receiving chips 15101 to 1510$i$ may individually receive digital data signals to be supplied to j pixels among differential signals for the image signal Simage transmitted from the display driving system 700 through an interface cable 710, may individually generate pixel data to be supplied to the j pixels on the basis of the received digital data signals, and may individually generate a reference clock and a data start signal from the differential signals for the image signal Simage. For example, when the interface cable 710 has first to $i^{th}$ lanes, the first image signal receiving chip 15101 may individually receive digital data signals corresponding to first to $j^{th}$ pixels from the differential signals for the image signal Simage transmitted from the display driving system 700 through the first lane of the interface cable 710, may individually generate pixel data corresponding to the first to $j^{th}$ pixels on the basis of the received digital data signals, and may individually generate a reference clock and a data start signal from the differential signals for the image signal Simage. Also, the $i^{th}$ image signal receiving chip 1510$i$ may individually receive digital data signals corresponding to m−j+1$^{th}$ to m$^{th}$ pixels from the differential signals for the image signal Simage transmitted from the display driving system 700 through the $i^{th}$ lane of the interface cable 710, may individually generate pixel data corresponding to the m−j+1$^{th}$ to m$^{th}$ pixels on the basis of the received digital data signals, and may individually generate a reference clock and a data start signal from the differential signals for the image signal Simage.

Each of the first to $i^{th}$ image signal receiving chips 15101 to 1510$i$ may generate display setting data for the timing controller chip array part 1500 from a differential signal of a first frame input through the interface cable 710, may store the display setting data in an internal memory, and may generate a digital data signal, a reference clock, and a data start signal from differential signals for frames that are sequentially input through the interface cable 710.

According to an aspect, the image signal receiving chip array 1510 may be composed of only one image signal receiving chip. That is, the first to $i^{th}$ image signal receiving chips 15101 to 1510$i$ may be configured as a single integrated image signal receiving chip.

The image quality improvement chip array 1530 may receive a frame-based digital data signal from the image signal receiving chip array 1510 and may execute a predetermined image quality improvement algorithm to improve the quality of an image corresponding to the frame-based digital data signal.

According to an aspect, the image quality improvement chip array 1530 may include first to $i^{th}$ image quality improvement chips 15301 to 1530$i$ connected on a one-to-one basis to the first to $i^{th}$ image signal receiving chips 15101 to 1510$i$. The first to $i^{th}$ image quality improvement chips 15301 to 1530$i$ may correspondingly receive digital data signals from the image signal receiving chips 15101 to 1510$i$ and may execute the predetermined image quality improvement algorithm to improve image quality according to the frame-based digital data signal. In this case, the first to $i^{th}$ image quality improvement chips 15301 to 1530$i$, each of which is a minimum unit of microchip or a single chipset, may be a single small-sized semiconductor packaging device with an integrated circuit including transistors.

In order to perform synchronization and data communication between the first to $i^{th}$ image quality improvement chips 15301 to 1530$i$, the first image quality improvement chip 15301 may be programmed as a master to control overall operations and functions in the image quality improvement chip array 1530, and each of the second to $i^{th}$ image quality improvement chips 15302 to 1530$i$ may be programmed as a slave to operate in synchronization with the first image quality improvement chip 15301.

Meanwhile, when the image signal receiving chip array 1510 is configured as a single integrated data receiving chip, the first to $i^{th}$ image quality improvement chips 15301 to 1530$i$ may be configured as a single integrated image quality improvement chip connected to the integrated data receiving chip.

On the basis of the reference clock and the data start signal provided from the image signal receiving chip array 1510, the data control chip array 1550 may arrange and outputs a digital data signal with image quality improved by the image quality improvement chip array 1530 as a 1-horizontal line-based pixel data.

As an example, the data control chip array 1550 may include first to $i^{th}$ data control chips 15501 to 1550$i$ connected on a one-to-one basis to the first to $i^{th}$ image quality improvement chips 15301 to 1530$i$. The first to $i^{th}$ data control chips 15501 to 1550$i$ may receive the digital data signal with improved image quality from the image quality improvement chips 15301 to 1530$i$ and may assign and output the digital data signal as pixel data according to the reference clock and the data start signal provided from the image signal receiving chip array 1510. In this case, the first to $i^{th}$ data control chips 15501 to 1550$i$, each of which is a minimum unit of microchip or a single chipset, may be a single small-sized semiconductor packaging device with an integrated circuit including transistors.

In order to perform synchronization and data communication between the first to $i^{th}$ data control chips 15501 to 1550$i$, the first data control chip 15501 may be programmed as a master to control overall operations and functions in the data control chip array 1550, and each of the second to $i^{th}$ data control chips 15502 to 1550$i$ may be programmed as a slave to operate in synchronization with the first data control chip 15501.

The first to $i^{th}$ data control chips 15501 to 1550$i$ may individually output pixel data through a serial data communication scheme using first to $i^{th}$ common serial data buses CSB1 to CSBi each having a data bus corresponding to the number of bits of the pixel data, may individually output the reference clock to first to $i^{th}$ common reference clock lines RCL1 to RCLi, and may individually output the data start signal to first to $i^{th}$ data start signal lines DSL1 to DSLi. For example, the first image signal receiving chip 15101 may transmit corresponding pixel data, a corresponding reference clock, and a corresponding data start signal through the first common serial data bus CSB1, the first common reference clock line RCL1, and the first data start signal line DSL1. Also, the $i^{th}$ image signal receiving chip 1510$i$ may transmit corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

Meanwhile, when the image signal receiving chip array 1510 may be configured as a single integrated data receiving chip and the image quality improvement chip array 1530 may be configured as a single integrated image quality improvement chip, the first to $i^{th}$ data control chips 15501 to 1550$i$ may be configured as a single integrated data control chip connected to the integrated data receiving chip.

The gate control chip 1570 may generate a gate clock GCLK and a gate start signal Vst on the basis of a reference clock output from the data control chip array 1550 and may provide the generated gate clock GCLK and gate start signal Vst to the gate driving chip array part 1200. For example, the gate control chip 1570 may receive a data start signal and a reference clock from the data start signal line DSL1 and the common reference clock line RCL1 connected to the most adjacent data control chip 15501 among the first to $i^{th}$ data control chips of the data control chip array 1550, and may count a reference clock on the basis of the received data start signal to generate the gate clock GCLK and the gate start signal Vst. The gate start signal Vst may be provided to the first gate driving chip 210 of the gate driving chip array part 1200 through a single gate start signal line 201 disposed on the substrate, and the gate clock GCLK may also be provided to the first gate driving chip 210 of the gate driving chip array part 1200 through a single gate clock line 202 disposed on the substrate.

As described above, by the timing controller chip array part 1500 being mounted on the substrate 110 of the display panel 100 and connected to the display driving system 700 through a single interface cable 710, it is possible to simplify a connection structure between the display panel 100 and the display driving system 700.

According to this example, the data driving chip array part 1300 of the display apparatus may include first to $m^{th}$ data latch chips L1 to Lm, first to $m^{th}$ digital-to-analog converter chips D1 to Dm, and first to $m^{th}$ data amp chips A1 to Am. In this case, the first to $m^{th}$ data latch chips L1 to Lm, the first to $m^{th}$ digital-to-analog converter chips D1 to Dm, and the first to $m^{th}$ data amp chips A1 to Am, each of which is a minimum unit of microchip or a single chipset, may be a single small-sized semiconductor packaging device with an integrated circuit including transistors.

Each of the first to $m^{th}$ data latch chips L1 to Lm may sample and latch (or hold) pixel data transmitted from the data control chip array 1550 of the timing controller chip array part 1500 according to the reference clock on the basis of the data start signal, and may output the received reference clock and the latched pixel data through a serial data communication scheme.

The first to $m^{th}$ data latch chips L1 to Lm may be grouped into first to $i^{th}$ data latch groups 13201 to 1320$i$, each of which consists of j data latch chips. On a group basis, the first to $i^{th}$ data latch groups 13201 to 1320$i$ may be connected on a one-to-one basis to the first to $i^{th}$ data control chips 15501 to 1550$i$.

On a group basis, the data latch chips grouped into the first to $i^{th}$ data latch groups 13201 to 1320$i$ may be commonly connected to the first to $i^{th}$ common serial data buses CSB1 to CSBi. For example, each of the first to $j^{th}$ data latch chips L1 to Lj grouped into the first data latch group 13201 may receive corresponding pixel data, a corresponding reference clock, and a corresponding start signal through the first common serial data bus CSB1, the first common reference clock line RCL1, and the first data start signal line DSL1. Also, each of m−j+1$^{th}$ to $m^{th}$ data latch chips Lm−j+1 to Lm grouped into the $i^{th}$ data latch group 1320$i$ may receive corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

When pixel data having a corresponding number of bits is sampled and latched, each of the first to $m^{th}$ data latch chips L1 to Lm outputs the received reference clock and the latched pixel data through a serial data communication scheme.

According to an aspect, each of the first to $m^{th}$ data latch chips L1 to Lm may include a latch circuit configured to sample and latch pixel data input through a corresponding common serial data bus CSB according to the reference clock in response to the data start signal, a counter circuit configured to count the reference clock and generate a data output signal, and a clock bypass circuit configured to bypass the received reference clock.

The first to $m^{th}$ digital-to-analog converter chips D1 to Dm may be connected on a one-to-one basis to the first to $m^{th}$ data latch chips L1 to Lm, and may be commonly connected to at least one reference gamma voltage supply line RGVL through which at least one reference gamma voltage Vgam is supplied from a power supply circuit. In this case, one of the digital-to-analog converter chips D1 to Dm may be connected to one of the data latch chips L1 to Lm through a single serial data transmission line SDTL and a single reference clock transmission line RCTL. The first to $m^{th}$ digital-to-analog converter chips D1 to Dm may receive and parallelize pixel data input from the corresponding data latch chips L1 to Lm through the serial data transmission line SDTL in a serial communication scheme according to the reference clock transmission line RCTL supplied from the corresponding data latch chips L1 to Lm. Then, the first to $m^{th}$ digital-to-analog converter chips D1 to Dm may convert parallel pixel data into data voltages on the basis of the reference gamma voltages supplied through the reference gamma voltage supply line RGVL and may output the data voltages.

According to an aspect, each of the first to m$^{th}$ digital-to-analog converter chips D1 to Dm may include a data parallelization circuit configured to receive and parallelize pixel data input in a serial data communication scheme, according to a reference clock, a grayscale voltage generating circuit configured to distribute reference gamma voltages and generate a plurality of grayscale voltages corresponding to a plurality of grayscale values according to the number of bits of the pixel data, and a clock counter configured to count the reference clock to generate a parallel data output signal.

Optionally, the grayscale voltage generating circuit of each of the first to m$^{th}$ digital-to-analog converter chips D1 to Dm may distribute pixel driving voltages Vdd supplied from the power supply circuit instead of the reference gamma voltages to generate a plurality of different grayscale voltages. In this case, the at least one reference gamma voltage supply line RGVL disposed in the non-display area of the substrate is omitted, and thus it is possible to increase space utilization of the non-display area of the substrate According to this example, by receiving pixel data from the data latch chips L1 to Lm in a serial data communication scheme, the first to m$^{th}$ digital-to-analog converter chips D1 to Dm has a minimum number of terminals for receiving the pixel data and thus may be decreased in size. As the number of data transmission lines between the digital-to-analog converter chips D1 to Dm and the data latch chips L1 to Lm increases, it is possible to increase the space utilization of the non-display area of the substrate.

The first to m$^{th}$ data amp chips A1 to Am may be connected on a one-to-one basis to the first to m$^{th}$ digital analog converter chips D1 to Dm, and may be connected on a one-to-one basis to the first to m$^{th}$ data lines DL1 to DLm. Also, the first to m$^{th}$ data amp chips A1 to Am may be commonly connect to a pixel driving voltage supply line PSL through which the pixel driving voltage Vdd is supplied from the power supply circuit and may be commonly connected to a ground voltage line through which a ground voltage is supplied from the power supply circuit. The first to m$^{th}$ data amp chips A1 to Am may buffer data voltages supplied from the corresponding digital-to-analog converter chips D1 to Dm on the basis of the pixel driving voltages Vdd, and may supply the buffered data voltages to the corresponding data lines DL1 to DLm. For example, each of the first to m$^{th}$ data amp chips A1 to Am may buffer and output a data voltage on a gain value set according to a line load of a corresponding data line.

Additionally, one data latch chip, one digital-to-analog conversion chip, and one data amp chip for supplying a data voltage to one data line constitute each of the data driving chip groups 13001 to 1300m, which may be configured as a single data driving chip. In this case, the number of chips connected to each of the first to m$^{th}$ data lines DL1 to DLm may decrease by a factor of ⅓.

As described above, the display apparatus according to another aspect of the present disclosure has the same effects as the display apparatus shown in FIGS. 1 to 19 and also facilitate simplification and integration of microchips by all circuit elements for displaying an image corresponding to an image signal supplied from the display driving system 700 on the display panel 100 being implemented as microchips and mounted on the substrate 110. Also, the display apparatus according to another aspect of the present disclosure may has improved aesthetic design property by being directly connected to the display driving system 700 through only one or two signal cables 710 and thus by having a simple connection structure with the display driving system 700 and also having a single plate shape.

Figure 24:
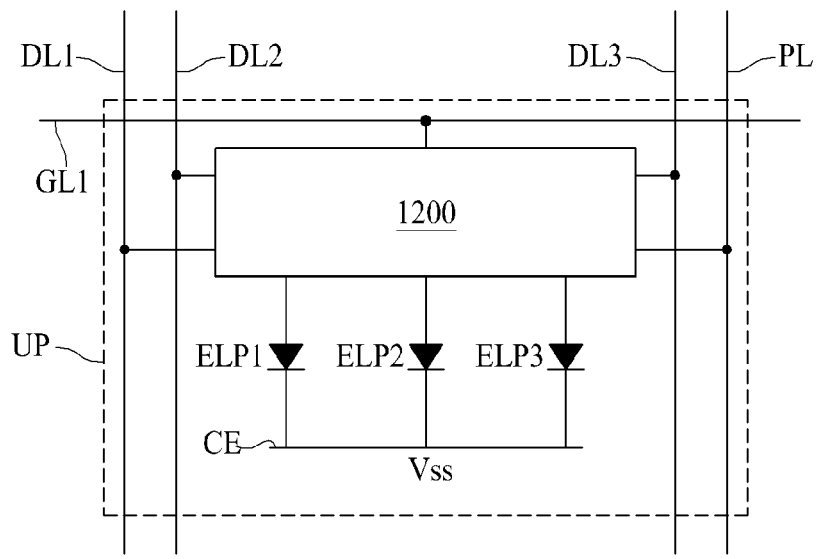
FIG. 24 is a view illustrating a unit pixel of a display apparatus according to still another aspect of the present disclosure.

FIG. 24 is a view illustrating a unit pixel of a display apparatus according to still another aspect of the present disclosure, which is configured by changing the pixel driving chip of the display apparatus shown in FIGS. 1 to 23. Thus, only the pixel driving chip and its associated elements will be described below, and repetitive descriptions of the other elements will be omitted.

Referring to FIG. 24, for the display apparatus according to still another aspect of the present disclosure, the pixel driving chip 1200 is disposed to drive one unit pixel UP having three adjacent pixels disposed in a direction of the gate line GL1.

The pixel driving chip 1200 may be mounted in a unit pixel area defined on the substrate and may be connected to three adjacent data lines DL1, DL2, and DL3, one gate line GL1, and one pixel driving power line PL and may also be connected to first to third light emission parts ELP1, ELP2, and ELP3. The pixel driving chip 1200 may control light emission of the first to third light emission parts ELP1, ELP2, and ELP3 by supplying, to the first to third light emission parts ELP1, ELP2, and ELP3, first to third data currents corresponding to first to third data voltages supplied from the first to third data lines DL1, DL2, and DL3 in response to a gate pulse supplied from the gate line GL1, on the basis of pixel driving power supplied from the pixel driving power line PL.

As an example, the pixel driving chip 1200 may include a gate bump connected to the gate line GL, first to third data bumps connected to the first to third data lines DL1, DL2, and DL3, a power input bump connected to the pixel driving power line PL, first to third output bumps connected to the first to third light emission parts ELP1, ELP2, and ELP3, a first pixel driving circuit configured to output, to a first output bump, a first data current corresponding to a first data voltage supplied through the first data bump in response to a gate pulse supplied through the gate bump, a second pixel driving circuit configured to output, to a second output bump, a second data current corresponding to a second data voltage supplied through the second data bump in response to the gate pulse supplied through the gate bump, and a third pixel driving circuit configured to output, to a third output bump, a third data current corresponding to a third data voltage supplied through the third data bump in response to the gate pulse supplied through the gate bump.

The first to third pixel driving circuits according to this example have the same configuration as the pixel driving circuit shown in FIG. 3, and thus a description thereof will be omitted.

According to still another aspect of the present disclosure, by driving one unit pixel UP through one pixel driving chip 1200, it is possible to decrease the number of pixel driving chips 1200 mounted on the substrate by a factor of ⅓ and thus to decrease a mounting process time of the pixel driving chips 1200 to increase the yield of the display apparatus.

One pixel driving chip 1200 according to this example may be disposed to drive two unit pixels having six adjacent pixels disposed in the direction of the gate line GL1. In this case, the one pixel driving chip 1200 may further include fourth to sixth pixel driving circuits that are commonly connected to the gate line GL and the pixel driving power line PL and connected on a one-to-one basis to fourth to sixth data lines.

Figure 25:
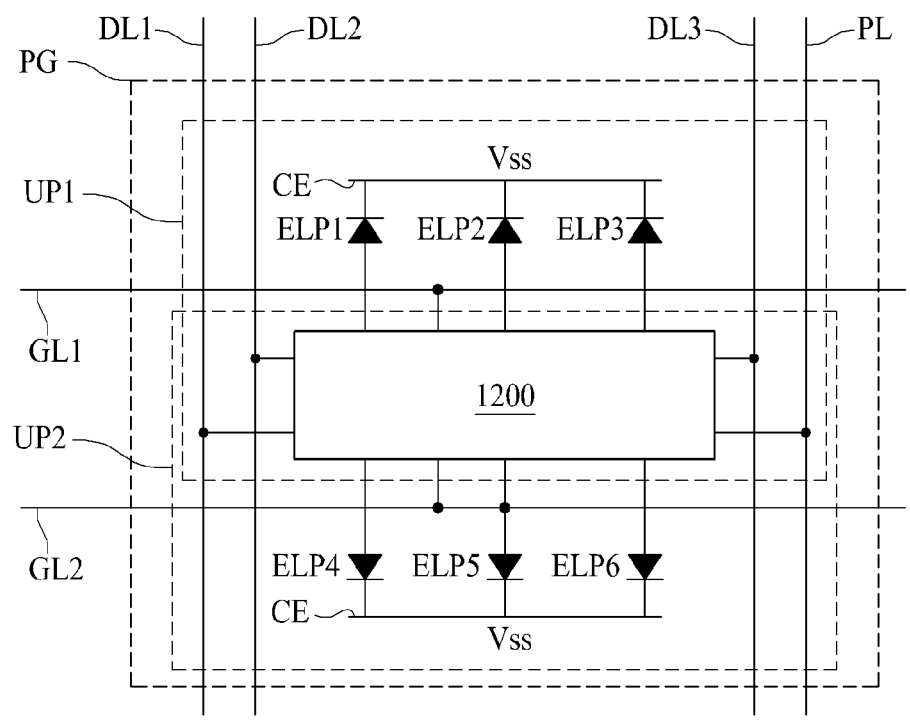
FIG. 25 is a view illustrating a unit pixel of a display apparatus according to still another aspect of the present disclosure.

FIG. 25 is a view illustrating a unit pixel of a display apparatus according to still another aspect of the present disclosure, which is configured by changing the pixel driving chip of the display apparatus shown in FIGS. 1 to 23. Thus, only the pixel driving chip and its associated elements will be described below, and repetitive descriptions of the other elements will be omitted.

Referring to FIG. 25, for the display apparatus according to still another aspect of the present disclosure, the pixel driving chip 1200 is disposed to drive a unit pixel group PG having two vertically adjacent unit pixels UP1 and UP2 connected to two adjacent gate lines GL1 and GL2.

The pixel driving chip 1200 may be mounted in a unit pixel area defined on the substrate and may be connected to three adjacent data lines DL1, DL2, and DL3, two adjacent gate lines GL1 and GL2, and one pixel driving power line PL A and may also be connected to first to sixth light emission parts ELP1 to ELP6. According to an aspect, the pixel driving chip 1200 may include first and second gate bumps connected to the first and second gate lines GL1 and GL2; first to third data bumps connected to the first to third data lines DL1, DL2, and DL3; a power input bump connected to the pixel driving power line PL; first to third output bumps connected to the first to third light emission parts ELP1, ELP2, and ELP3; first to third pixel driving circuits commonly connected to the first gate bump and the power input bump, individually connected to the first to third data bumps, and individually connected to the first to third output bumps; and fourth to sixth pixel driving circuits commonly connected to the second gate bump and the power input bump, individually connected to the first to third data bumps, and individually connected to first to third output bumps. The first to sixth pixel driving circuits according to this example have the same configuration as the pixel driving circuit shown in FIG. 3, and thus a description thereof will be omitted.

According to this example, the pixel driving chip 1200 may control light emission of the first to third light emission parts ELP1, ELP2, and ELP3 by supplying, to the first to third light emission parts ELP1, ELP2, and ELP3, first to third data currents corresponding to first to third data voltages supplied from the first to third data lines DL1, DL2, and DL3 in response to a first gate pulse supplied from the gate line GL1, on the basis of pixel driving power supplied from the pixel driving power line PL. Also, the pixel driving chip 1200 may control light emission of the first to third light emission parts ELP1, ELP2, and ELP3 by supplying, to the first to third light emission parts ELP1, ELP2, and ELP3, first to third data currents corresponding to first to third data voltages supplied from the first to third data lines DL1, DL2, and DL3 in response to the first gate pulse supplied from the gate line GL1, on the basis of pixel driving power supplied from the pixel driving power line PL. Also, the pixel driving chip 1200 may control light emission of the fourth to sixth light emission parts ELP4, ELP5, and ELP6 by supplying, to the fourth to sixth light emission parts ELP4, ELP5, and ELP6, fourth to sixth data currents corresponding to fourth to sixth data voltages supplied from the first to third data lines DL1, DL2, and DL3 in response to a second gate pulse supplied from the gate line GL2, on the basis of pixel driving power supplied from the pixel driving power line PL.

According to still another aspect of the present disclosure, by driving one unit pixel group PG having two adjacent unit pixels UP1 and UP2 through one pixel driving chip 1200, it is possible to decrease the number of pixel driving chips 1200 mounted on the substrate by a factor of ⅙ and thus to decrease a mounting process time of the pixel driving chips 1200 to increase the yield of the display apparatus.

According to this example, one pixel driving chip 1200 may be disposed to drive a total of 12 pixels through two gate lines and six data lines. In this case, the one pixel driving chip 1200 may include a total of 12 pixel driving circuits. It is possible to decrease the number of pixel driving chips 1200 mounted on the substrate by a factor of 1/12, and thus to decrease a mounting process time of the pixel driving chips to increase the yield of the display apparatus.

According to the present disclosure, it is possible to simplify a connection structure between a display driving system and a display panel, and thus to enhance aesthetic design property of the display apparatus.

Also, according to the present disclosure, by implementing a data driving circuit and a gate driving circuit for driving each pixel of the display panel as a microchip and mounting the microchip on a substrate, it is possible to omit a process of forming at least one thin film transistor for each pixel of a general display panel.

The features, structures, and effects described in the above examples of the present disclosure are incorporated into at least one aspect of the present disclosure, but are not limited to only one example. Moreover, the features, structures, and effects exemplified in at least one aspect of the preset disclosure can easily be combined and modified for other examples and then be carried out by those skilled in the art. Therefore, these combinations and modifications should be construed as falling within the scope of the present disclosure.

The present disclosure is not limited to the aforementioned aspects and the accompanying drawings, and it will be apparent to those skilled in the art that various substitutions, modifications, and changes can be made without departing from the technical spirit of the present disclosure. Therefore, the scope of the present disclosure is defined by the appended claims, and all changes or modifications derived from the meaning and scope of the claims and their equivalents should be construed as being included within the scope of the present disclosure.

What is claimed is:

1. A display apparatus comprising:
   a substrate including a display area having a plurality of pixel areas and a non-display area surrounding the display area;
   first to $n^{th}$ gate lines passing through the display area, where n is a natural number;
   first to $m^{th}$ data lines passing through the display area, where m is a natural number;
   first to $m^{th}$ pixel driving power lines passing through the display area;
   a plurality of pixels each having a pixel driving chip mounted in at least one of the plurality of pixel areas and connected to a gate line, a data line, and a pixel driving power line adjacent to the pixel driving chip and a light emission part connected to the pixel driving chip;
   a gate driving chip array part mounted in the non-display area and connected to the first to $n^{th}$ gate lines;
   a data driving chip array part mounted in the non-display area and connected to the first to $m^{th}$ data lines; and
   a timing controller providing a digital data signal, a reference clock, and a data start signal to the data driving chip array part through a high-speed serial interface scheme, and providing a gate start signal and a gate clock to the gate driving chip array part through corresponding a gate start signal line and a gate clock line,
   wherein the gate driving chip array part includes first to $n^{th}$ gate driving chips connected to the first to nth gate lines on a one-to-one basis, and the first to n$^{th}$ gate driving chips are cascade-connected one another, and wherein each of the first to n$^{th}$ gate driving chips outputs the gate start signal to a corresponding gate line as a gate pulse according to the gate clock and supplies an output signal and the gate clock to a gate driving chip disposed at a next stage, and wherein the gate clock line is only configured to be connected to the first gate driving chip of the first to nth gate driving chips that are cascaded.

2. The display apparatus of claim 1, wherein the pixel driving chip includes:
   at least one gate bump connected to at least one adjacent gate line among the first to n$^{th}$ gate lines;
   at least one data bump connected to at least one adjacent data line among the first to m$^{th}$ data lines;
   at least one power input bump connected to at least adjacent pixel driving power line among the first to m$^{th}$ pixel driving power lines; and
   an output bump connected to at least one light emission part.

3. The display apparatus of claim 1, wherein the gate pulse has an output time delayed from an output time of the gate clock in each of the first to nth gate driving chips.

4. The display apparatus of claim 1, further comprising a gate buffer chip mounted in the display area and connected to the first to n$^{th}$ gate lines,
   wherein each of the first to nth gate lines is divided into first and second partial lines by a separation part disposed in the display area, and the gate buffer chip is disposed on the separation part and electrically connected between the first to second partial lines.

5. The display apparatus of claim 4, wherein the gate buffer chip includes:
   a first bump connected to the first partial line;
   a second bump connected to the second partial line;
   a third bump connected to an adjacent pixel driving power line; and
   a fourth bump receiving cathode power.

6. The display apparatus of claim 1, wherein the data driving chip array part includes:
   a data receiving chip array receiving an input digital data signal and outputting a 1-horizontal line unit of pixel data;
   first to m$^{th}$ data latch chips connected to the data receiving chip array;
   first to m$^{th}$ digital-to-analog converter chips connected to the first to m$^{th}$ data latch chips on a one-to-one basis; and
   first to m$^{th}$ data amp chips connected to the first to m$^{th}$ digital-to-analog converter chips on a one-to-one basis and connected to the first to m$^{th}$ data lines on a one-to-one basis.

7. The display apparatus of claim 6, wherein each of the first to m$^{th}$ data latch chips outputs a reference clock and latched pixel data through a serial data communication scheme, and each of the first to m$^{th}$ digital-to-analog converter chips receives and parallelizes the pixel data input through the serial data communication scheme according to the reference clock and then converts the parallelized pixel data into a data voltage based on at least one reference gamma voltage.

8. The display apparatus of claim 6, wherein the first to m$^{th}$ data latch chips are grouped into first to i$^{th}$ data latch groups, each group includes j data latch chips (j is a natural number greater than or equal to two), and the data receiving chip array includes first to i$^{th}$ data receiving chips receiving corresponding data signals from the first to i$^{th}$ data latch groups and output corresponding pixel data to the first to i$^{th}$ data latch groups.

9. The display apparatus of claim 1, further comprising:
   a pad part disposed at a side of the non-display area; and
   a control board connected to the pad part through a signal cable.

10. The display apparatus of claim 9, wherein the image signal is provided to the timing controller through a V-by-One interface scheme, and the digital data signal is provided to the data driving chip array part through an embedded point to point interface (EPI) scheme.

11. The display apparatus of claim 1, further comprising:
    a plurality of touch electrodes disposed in the display area and overlapping at least one pixel;
    a plurality of touch routing lines connected to the plurality of touch electrodes on a one-to-one basis; and
    a touch sensing chip array part mounted in the non-display area and connected to the plurality of touch routing lines.

12. The display apparatus of claim 11,
    wherein the touch sensing chip array part includes:
    a plurality of touch sensing chips each disposed between two adjacent gate driving chips of the first to n$^{th}$ gate driving chips, connected to the plurality of touch electrodes through the plurality of touch routing lines, and generating touch presence data, based on a change in capacitance of the corresponding touch electrodes; and
    a touch processing chip collecting the touch presence data provided from the plurality of touch sensing chips, generating touch map data, and providing the generated touch map data to a display driving system.

13. The display apparatus of claim 12, wherein each of the plurality of touch sensing chips receives the gate start signal and the gate clock from a gate driving chip disposed at a previous stage, generates touch presence data, based on a change in capacitance of a corresponding touch electrode according to the gate clock, provides the touch presence data to the touch processing chip, and supplies the received gate clock and gate start signal to the gate driving chip disposed at the next stage.

14. The display apparatus of claim 13, wherein the touch processing chip collects touch presence data of the plurality of touch sensing chips transmitted via at least one touch sensing chip according to a first-input first-output (FIFO) data transmission between the plurality of touch sensing chips.

15. The display apparatus of claim 1, further comprising a timing controller chip array part mounted in the non-display area and generating a digital data signal based on an input image signal, providing the digital data signal to the data driving chip array part, and providing the gate clock and the gate start signal to the gate driving chip array part.

16. The display apparatus of claim 15, wherein the timing controller chip array part includes:
    an image signal receiving chip array having at least one image signal receiving chip generating a digital data signal and a reference clock for a frame, based on the input image signal;
    an image quality improvement chip array having at least one image quality improvement chip for improving quality of an image corresponding to the digital data signal for the frame;
    a data control chip array having at least one data control chip configured to align and output the digital data signal with quality improved by the image quality improvement chip array as a 1-horizontal line unit of pixel data based on the reference clock; and a gate control chip generating the gate clock and the gate start signal based on the reference clock, and providing the gate clock and the gate start signal to the gate driving chip array part.

17. The display apparatus of claim 16, wherein the image signal is provided to the image signal receiving chip array through a V-by-One interface scheme.

18. The display apparatus of claim 16, wherein the data driving chip array part includes:

first to $m^{th}$ data latch chips connected to the data control chip array;

first to $m^{th}$ digital-to-analog converter chips connected to the first to $m^{th}$ data latch chips on a one-to-one basis; and first to $m^{th}$ data amp chips connected to the first to $m^{th}$ digital-to-analog converter chips and connected on a one-to-one basis to the first to $m^{th}$ data lines on a one-to-one basis.

19. The display apparatus of claim 16, wherein the image signal receiving chip array has a first image signal receiving chip operating as a master and second to $i^{th}$ image signal receiving chips (i is a natural number greater than or equal to two) each operating as a slave synchronized with the first image signal receiving chip, the image quality improvement chip array includes a first image quality improvement chip connected to the first image signal receiving chip to operate as a mater and second to $i^{th}$ image quality improvement chips connected to the second to $i^{th}$ image signal receiving chips on a one-to-one basis to each operate as a slave synchronized with the first image quality improvement chip, and the data control chip array includes a first data control chip connected to the first image quality improvement chip to operate as a master and second to $i^{th}$ data control chips connected on to the second to $i^{th}$ image quality improvement chips a one-to-one basis to each operate as a slave synchronized with the first data control chip.

20. The display apparatus of claim 19, wherein the data driving chip array part includes:

first to $m^{th}$ data latch chips connected to the data control chip array;

first to $m^{th}$ digital-to-analog converter chips connected on a one-to-one basis to the first to $m^{th}$ data latch chips on a one-to-one basis; and first to $m^{th}$ data amp chips connected to the first to $m^{th}$ digital-to-analog converter chips on a one-to-one basis and connected to the first to $m^{th}$ data lines on a one-to-one basis, and the first to $m^{th}$ data latch chips grouped in units of j data latch chips and connected to the first to $i^{th}$ data control chips by group.

21. The display apparatus of claim 20, wherein each of the first to $m^{th}$ data latch chips outputs the reference clock and latched pixel data through a serial data communication scheme, and each of the first to $m^{th}$ digital-to-analog converter chips receives and parallelizes the pixel data input through the serial data communication scheme according to the reference clock and then converts the parallelized pixel data into a data voltage based on a plurality of reference gamma voltages.

22. The display apparatus of claim 15, further comprising a power management chip array part mounted in the non-display area and performing DC-DC conversion on power input from an external source and outputting the converted power.

23. The display apparatus of claim 22, wherein the power management chip array part includes:

a logic power chip generating a transistor logic voltage and cathode power based on the input power;

a driving power chip generating pixel driving power based on the input voltage; and a gamma voltage generating chip generating at least one reference gamma voltage using the transistor logic voltage and the pixel driving voltage.

24. The display apparatus of claim 15, further comprising:

a plurality of touch electrodes disposed in the display area and overlapping at least one pixel;

a plurality of touch routing lines connected to the plurality of touch electrodes on a one-to-one basis; and a touch sensing chip array part mounted in the non-display area and connected to the plurality of touch routing lines.

25. The display apparatus of claim 24, wherein the touch sensing chip array part includes:

a plurality of touch sensing chips each disposed between two adjacent gate driving chips of the first to $n^{th}$ gate driving chips, connected to the plurality of touch electrodes through the plurality of touch routing lines, and generating touch presence data based on a change in capacitance of the corresponding touch electrodes; and a touch processing chip collecting the touch presence data provided from the plurality of touch sensing chips, generating touch map data, and providing the generated touch map data to a display driving system.

26. The display apparatus of claim 25, wherein each of the plurality of touch sensing chips receives the gate start signal and the gate clock from a gate driving chip disposed at a previous stage, generates touch presence data, based on a change in capacitance of a corresponding touch electrode according to the gate clock, provides the touch presence data to the touch processing chip, and supplies the received gate clock and gate start signal to the gate driving chip disposed at the next stage.

27. The display apparatus of claim 26, wherein the touch processing chip collects touch presence data of the plurality of touch sensing chips transmitted via at least one touch sensing chip according to FIFO data transmission between the plurality of touch sensing chips.

28. The display apparatus of claim 25, further comprising a power management chip array part mounted in the non-display area and performing dc-dc conversion on power input from an external source and transmit, to the display driving system, the touch map data provided from the touch processing chip.

29. The display apparatus of claim 28, wherein the power management chip array part includes:

a DC-DC converter chip array part performing dc-dc conversion based on the input power; and a serial communication chip receiving a voltage tuning signal input from the display driving system, delivering the voltage tuning signal to the DC-DC converter chip array part, and transmitting the touch map data provided from the touch processing chip to the display driving system.

30. The display apparatus of claim 29, wherein the DC-DC converter chip array part includes:

a logic power chip generating a transistor logic voltage and cathode power based on the input power; a driving power generating pixel driving voltage based on the input power; and a gamma voltage generating chip generating at least one reference gamma voltage using the transistor logic voltage and the pixel driving voltage.

31. The display apparatus of claim 24, further comprising:
a sealing layer disposed on the substrate and covering the light emission parts disposed in the plurality of pixel areas;
a plurality of touch routing lines disposed on the sealing layer and connected to the touch sensing chip array part; and
a touch insulating layer covering the plurality of touch routing lines,
wherein the plurality of touch electrodes are disposed on the touch insulating layer and connected to the plurality of touch routing lines on a one-to-one basis.

32. A display apparatus including a substrate where a display area and a non-display area are defined, a plurality of pixel areas disposed in the display area and the non-display area surrounding the display area, comprising:
first to $n^{th}$ gate lines passing through the display area, where n is a natural number;
first to $m^{th}$ data lines passing through the display area, where m is a natural number;
first to $m^{th}$ pixel driving power lines passing through the display area;
a pixel driving chip mounted in at least one of the plurality of pixel areas and connected to a gate line, a data line, and a pixel driving power line adjacent to the pixel driving chip;
a light emission part connected to the pixel driving chip;
a gate driving chip array part mounted in the non-display area, connected to the first to $n^{th}$ gate lines and including first to $n^{th}$ gate driving chips connected to the first to nth gate lines on a one-to-one basis, and the first to $n^{th}$ gate driving chips are cascade-connected one another; and
a data driving chip array part mounted in the non-display area and connected to the first to $m^{th}$ data lines; and
a timing controller providing a digital data signal, a reference clock, and a data start signal to the data driving chip array part through a high-speed serial interface scheme, and providing a gate start signal and a gate clock to the gate driving chip array part through corresponding a gate start signal line and a gate clock line,
wherein each of the first to $n^{th}$ gate driving chips outputs the gate start signal to a corresponding gate line as a gate pulse according to the gate clock and supplies an output signal and the gate clock to a gate driving chip disposed at a next stage, and
wherein the gate clock line is only configured to be connected to the first gate driving chip of the first to nth gate driving chips that are cascaded.

33. The display apparatus of claim 32, wherein the pixel driving chip includes:
at least one gate bump connected to at least one adjacent gate line among the first to $n^{th}$ gate lines;
at least one data bump connected to at least one adjacent data line among the first to $m^{th}$ data lines;
at least one power input bump connected to at least adjacent pixel driving power line among the first to $m^{th}$ pixel driving power lines; and
an output bump connected to at least one light emission part.

34. The display apparatus of claim 32, further comprising:
a pad part disposed at a side of the non-display area; and
a control board connected to the pad part through a signal cable.

35. The display apparatus of claim 32, further comprising:
a plurality of touch electrodes disposed in the display area and overlapping at least one pixel;
a plurality of touch routing lines connected to the plurality of touch electrodes on a one-to-one basis; and
a touch sensing chip array part mounted in the non-display area and connected to the plurality of touch routing lines.

36. The display apparatus of claim 32, further comprising a timing controller chip array part mounted in the non-display area and generating a digital data signal based on an input image signal, providing the digital data signal to the data driving chip array part, and providing the gate clock and the gate start signal to the gate driving chip array part.

37. The display apparatus of claim 32, wherein the gate pulse has an output time delayed from an output time of the gate clock in each of the first to nth gate driving chips.

* * * * *